United States Patent [19]
Kim et al.

[11] Patent Number: 5,844,270
[45] Date of Patent: Dec. 1, 1998

[54] FLASH MEMORY DEVICE AND MANUFACTURING METHOD THEREFOR

[75] Inventors: Keon-soo Kim; Yong-bae Choi; Jong-weon Yoo, all of Kyungki-do, Rep. of Korea

[73] Assignee: Samsung Electronics Co., Ltd., Rep. of Korea

[21] Appl. No.: 763,941

[22] Filed: Dec. 12, 1996

Related U.S. Application Data

[63] Continuation-in-part of Ser. No. 685,458, Jul. 19, 1996.

[30] Foreign Application Priority Data

May 17, 1996 [KR] Rep. of Korea ...................... 96-16737

[51] Int. Cl.$^6$ .................................................... H01L 29/00
[52] U.S. Cl. ......................... 257/315; 257/316; 257/506; 257/509; 257/510; 257/513; 257/519
[58] Field of Search .................................. 257/315, 316, 257/506, 509, 510, 513, 519

[56] References Cited

U.S. PATENT DOCUMENTS

| | | | |
|---|---|---|---|
| 5,610,419 | 3/1997 | Tanaka | 257/315 |
| 5,610,420 | 3/1997 | Kuroda et al. | 257/315 |

OTHER PUBLICATIONS

S. Tam et al., *A High Density CMOS 1-T Electrically Erasable Non–Volatile (Flash) Memory Technology*, VLSI Technology, 1988, IV–4, pp. 31–32.

Gautam Verma et al., *Reliability Performance of ETOX Based Flash Memories*, 1988 IEEE/IRPS, pp. 158–166.

Shin–ichi Kobayashi et al., *Memory Array Architecture and Decoding Scheme For 3V Only Sector Erasable DINOR Flash Memory*, VLSI Circuits, 1993, pp. 97–98.

(List continued on next page.)

*Primary Examiner*—Valencia Wallace
*Attorney, Agent, or Firm*—Myers Bigel Sibley & Sajovec, P.A.

[57] ABSTRACT

A highly integrated flash memory device having a stable cell is provided. The device includes a semiconductor substrate of a first conductive type; a field insulating layer buried in a first trench formed in the semiconductor substrate in order to define an active region; a tunnel insulating film formed on the active region; a first conductive layer for a floating gate formed on the tunnel insulating film; spacers formed on both the tunnel insulating film and the sidewalls of the first conductive layer; a buried insulating layer buried in a second trench formed by etching the substrate adjacent to the spacers; a buried junction layer contacting a lower portion and sidewalls of the buried insulating layer, and acting as a source and drain region including impurities of a second conductive type; a second conductive layer formed on the first conductive layer and connected to the first conductive layer to be used as a floating gate; an insulating layer formed on the second conductive layer; and a third conductive layer for a control gate formed on the insulating layer. Accordingly, the flash memory device has a cell capable of maintaining stable operation and is appropriate for high-integration.

10 Claims, 33 Drawing Sheets

OTHER PUBLICATIONS

"A High Capacitive–Coupling Ratio (HiCR) Cell For 3V–only 64 Mbit And Future Flash Memories" by Yosiaki S. Hisamune, Kohji Kanamori, Taishi Kubota, Yoshiyuki Suzuki Masaru Tsukji, Eiji Hasegawa, Akihiko Ishitani, and Takeshi Okazawa. 1993 IEEE—IEDM, pp. 19–22.

"A 0.4–um2 Self–Aligned Contactless Memory Cell Technology Suitable For 256–Mbit Flash Memories", by Masataka Kato, Tetsuo Adachi, Toshihiro Tanaka, Akihiko Sato, Takashi Kobayashi, Yoshimi Sudo, Tada Morimoto, Hitoshi Kume, Takashi Nishida and Katsutaka Kimura. IEDM 94, pp. 921–923.

"A 1.28um2 Contactless Memory Cell Technology For A 3V–Only 64Mbit EEPROM". Hitoshi Kume, Masataka Kato, Tetsuo Adachi, Toshihiro Tanaka, Toshio Sasaki, Tsutomu Okazaki, Naoki Miyamoto, Shun–ichi Saeki, Yuzuru Ohji, Masahiro Ushiyama, Jiro Yugami, Tasao Morimoto, and Takashi Nishida, IEDM 92, pp. 991–993.

"Memory Array Architecture And Decoding Scheme For 3 V Only Sector Erasable DINOR Flash Memory", by Shin–ichi Kobayashi, Hiroaki Nakai, Yuichi Kunori, Takeshi Nakayama, Yoshikazu Miyawaki, Yasushi Terada. 1994 IEEE Journal of Solid–State Circuits, vol. 29, No. 4, pp. 454–457.

"A Single Transistor EEPROM Cell And Its Implementation In a 512K CMOS EEPROM", by Satyen Mukherjee, Thomas Chang, Richard Pang, Mark Knecht and Dan Hu. IEDM 85, pp. 616–619.

"A Novel Cell Structure Suitable For A 3 Volt Operation, Sector Erase Flash Memory", by H. Onoda, Y. Kunori, S. Kobayashi, M. Ohi, A Fukumoto, N. Ajika and H. Miyoshi. 1992 IEDM, pp. 599–602.

International Electron Devices Meeting, Washington, D.C., Dec. 10–13, 1995; Session 11. "A Novel Dual String NOR (DuSNOR) Memory Cell Technology Scalable To The 256 Mbit and 1 Gbit Flash Memories" by K.S. Kim, J.Y. Kim, J.W. Yoo, Y.B. Choi, M.K. Kim, B.Y. Nam, K.T. Park, S.T. Ahn, and O.H. Kwon, pp. 263–266.

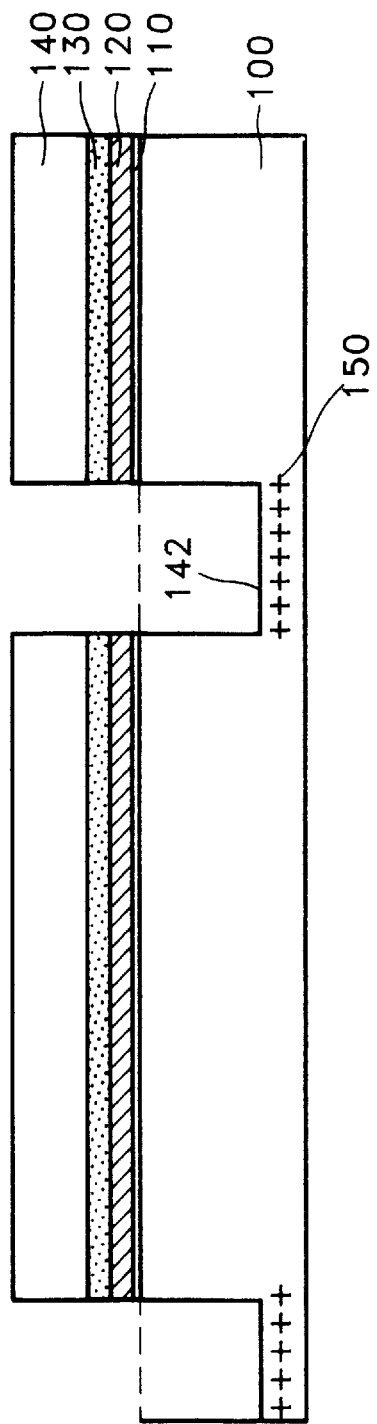
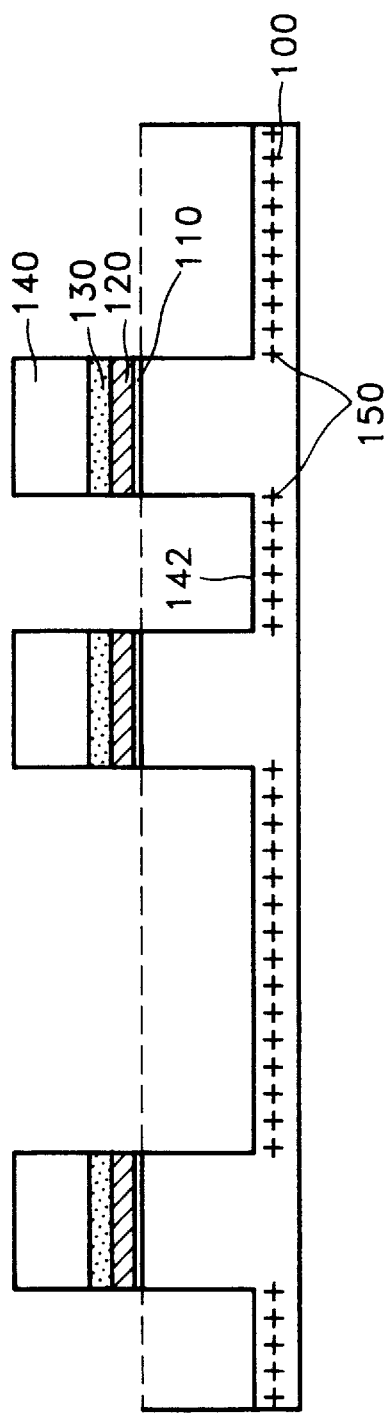

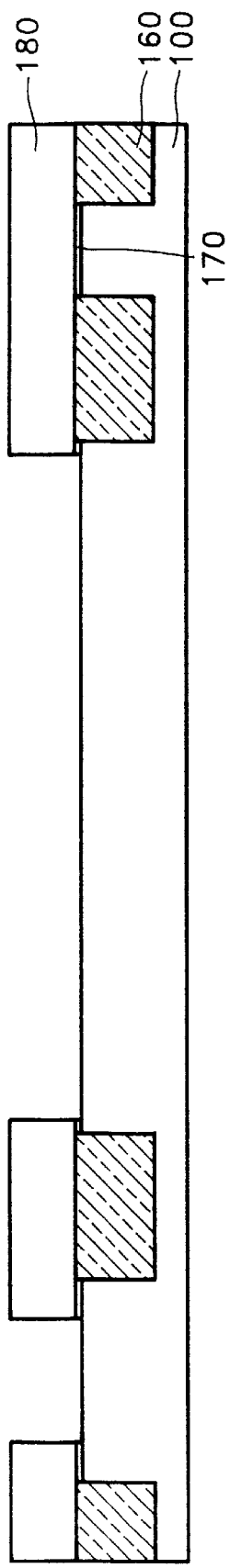
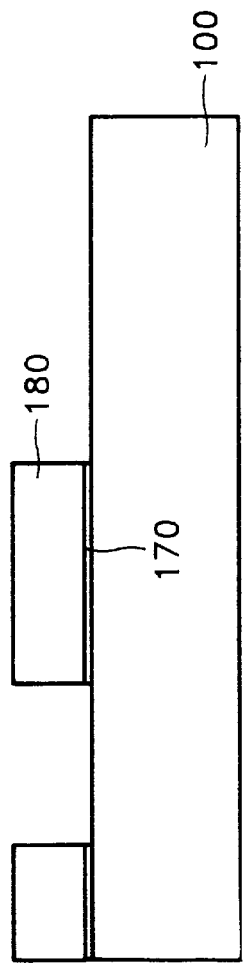

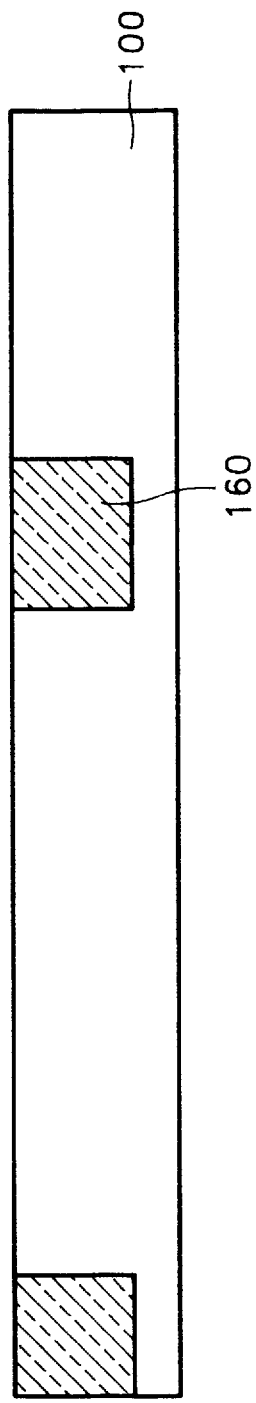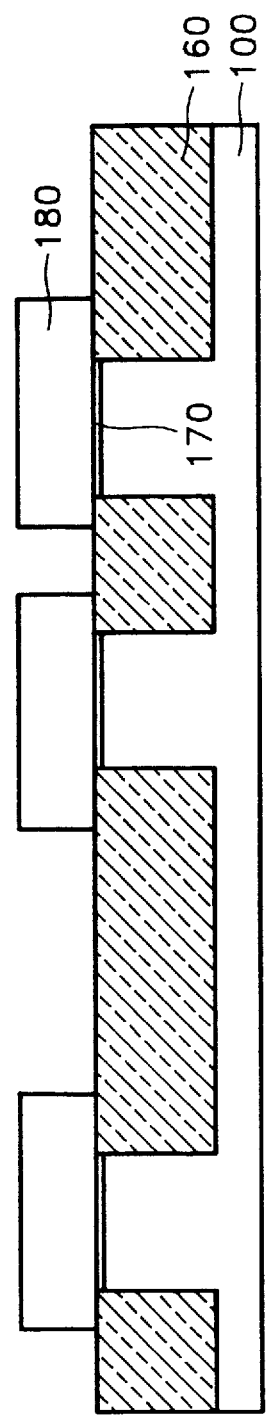

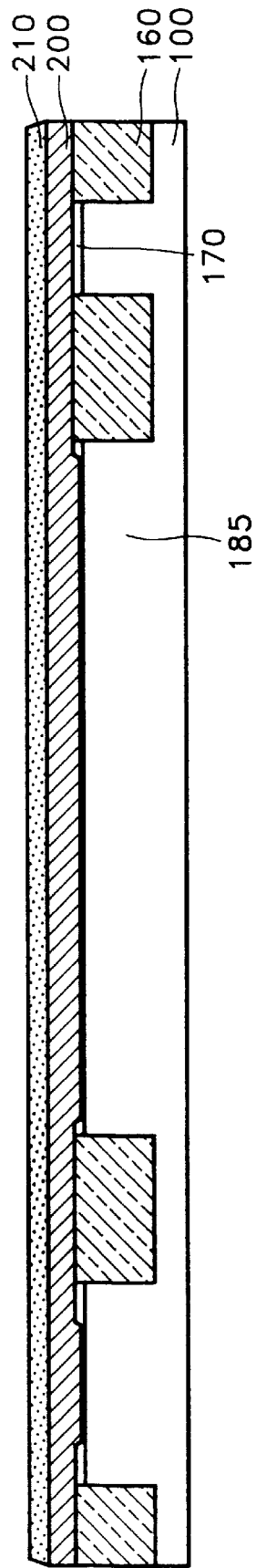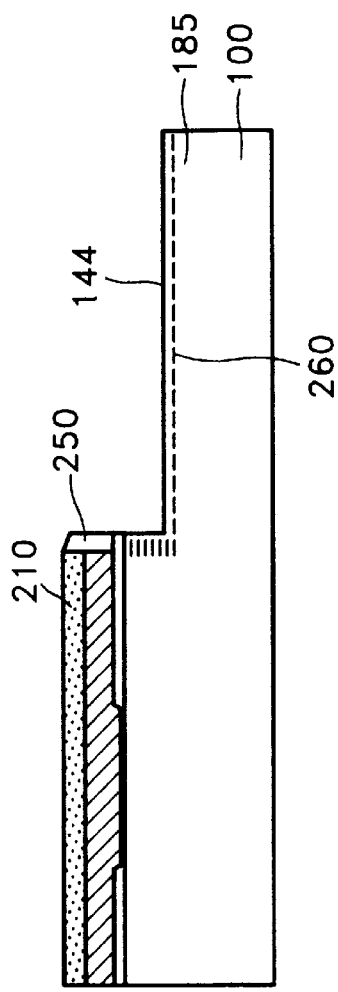

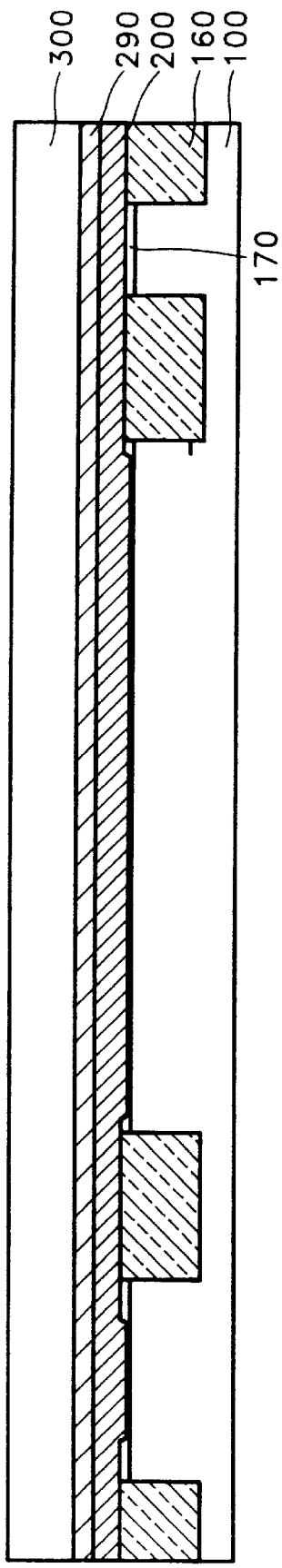
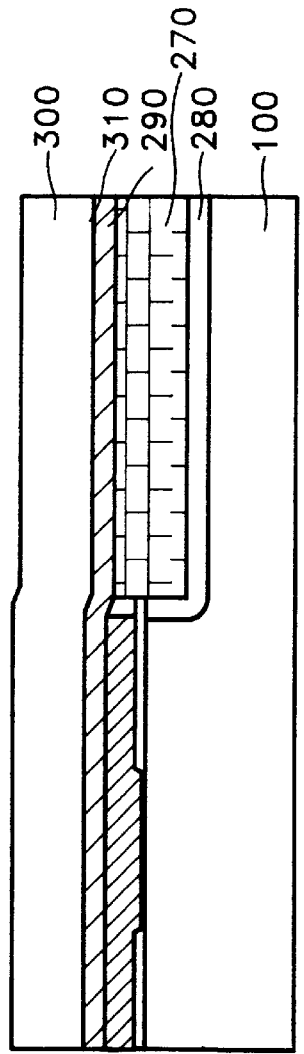
FIG. 13A
FIG. 13B

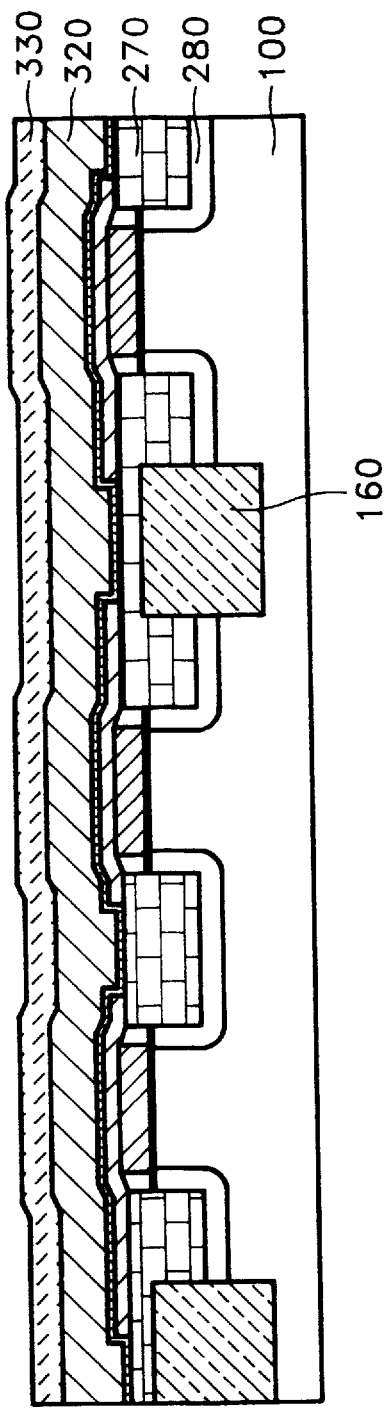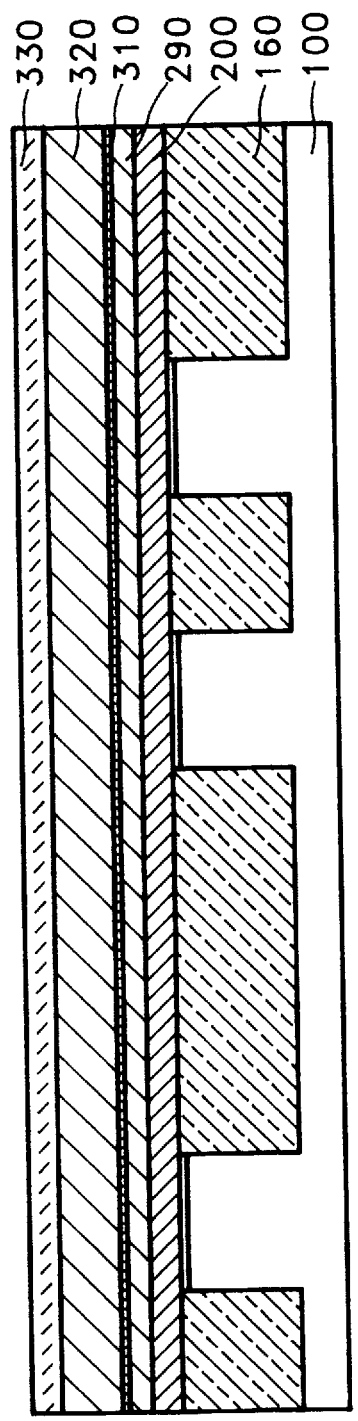

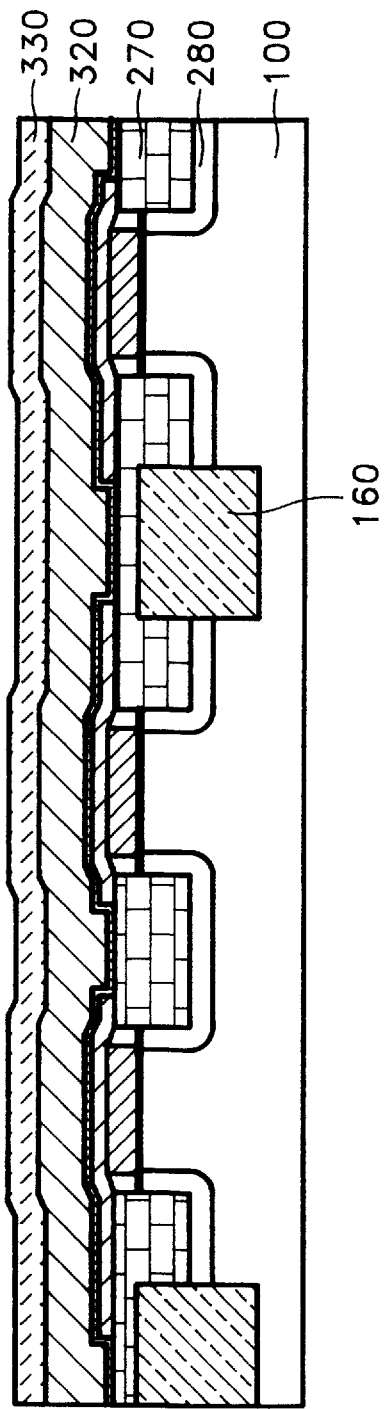
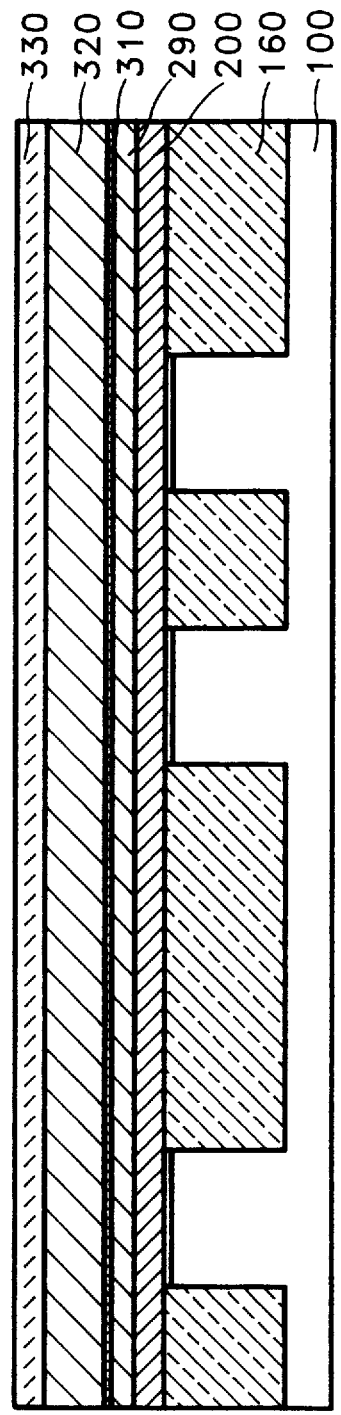

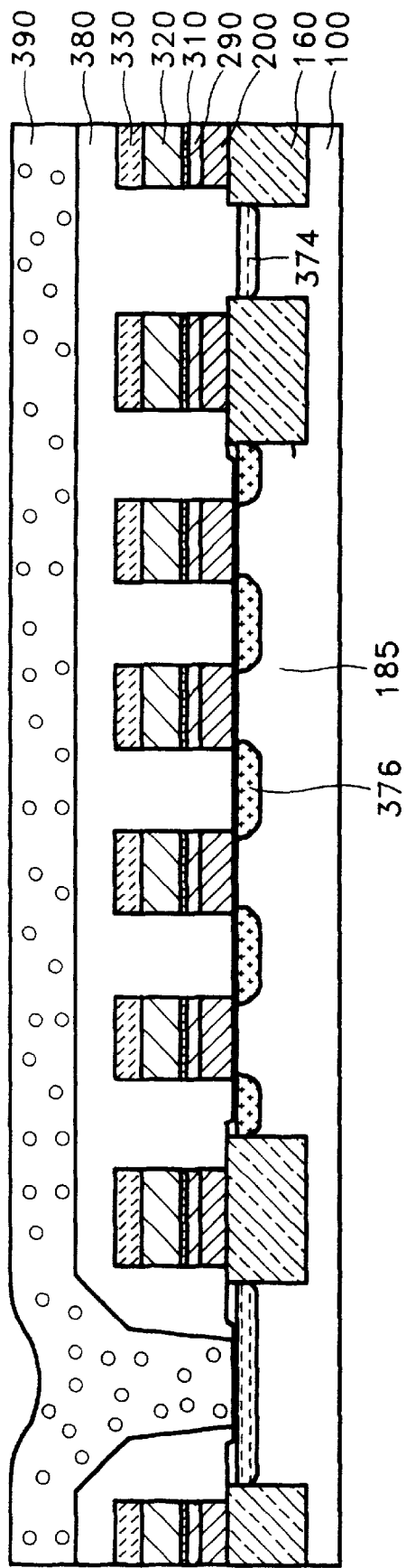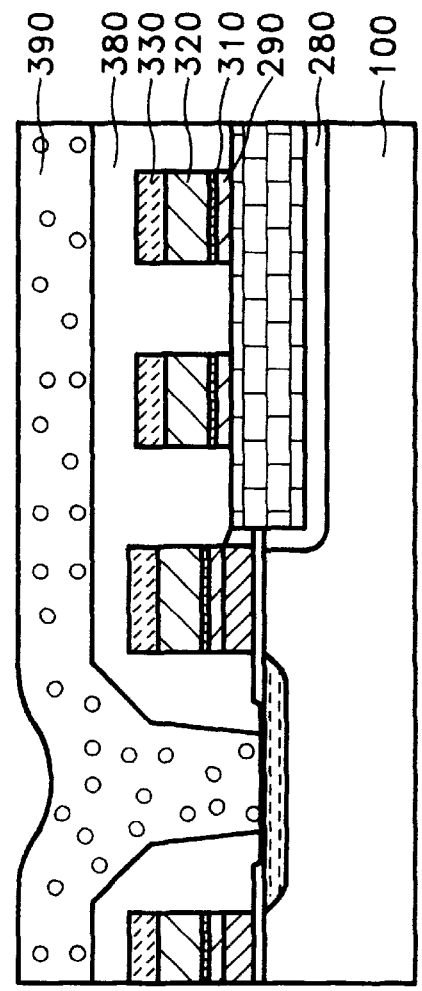

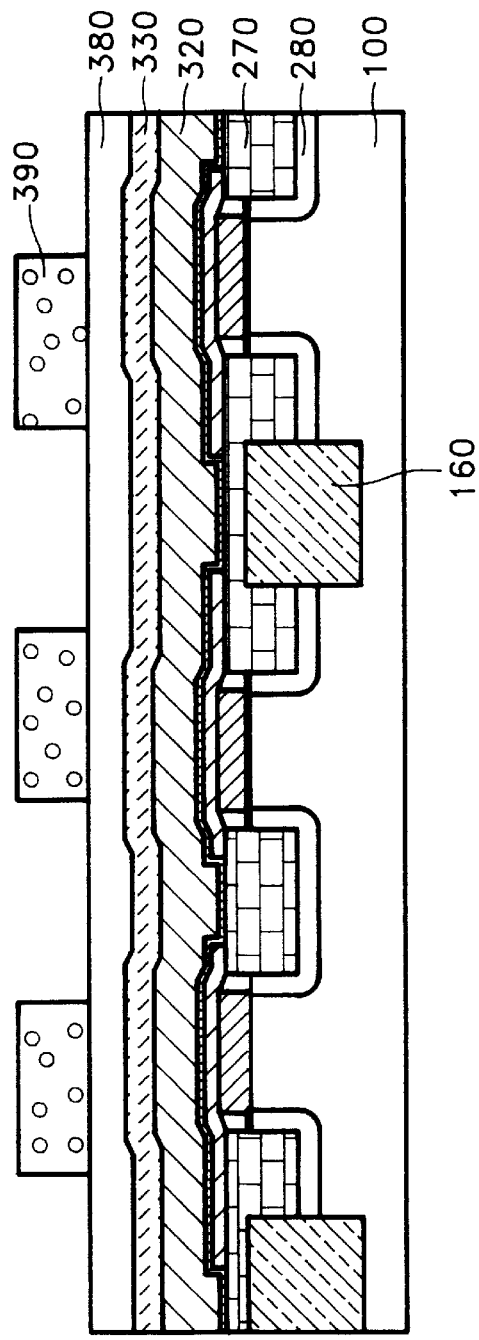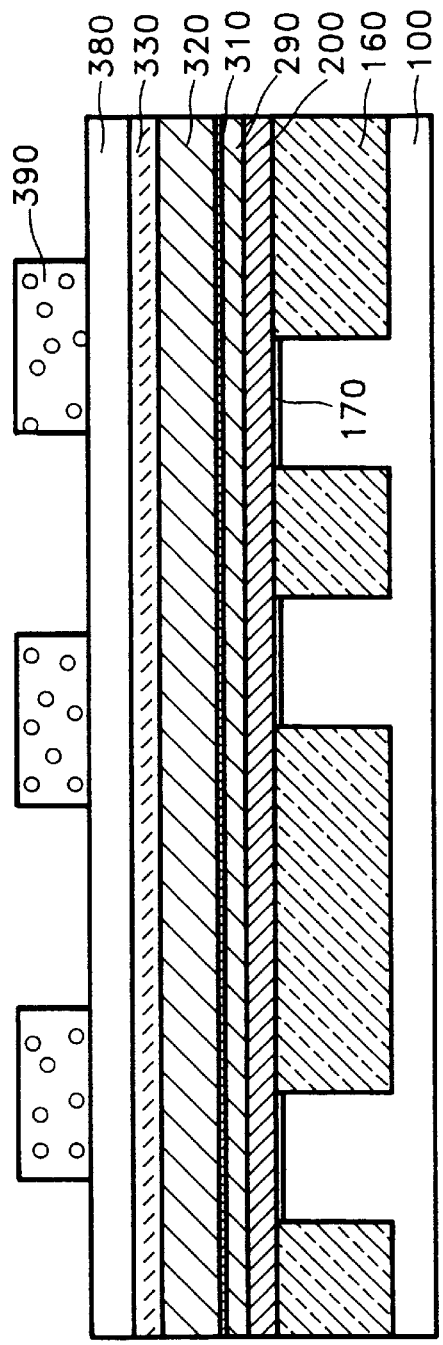

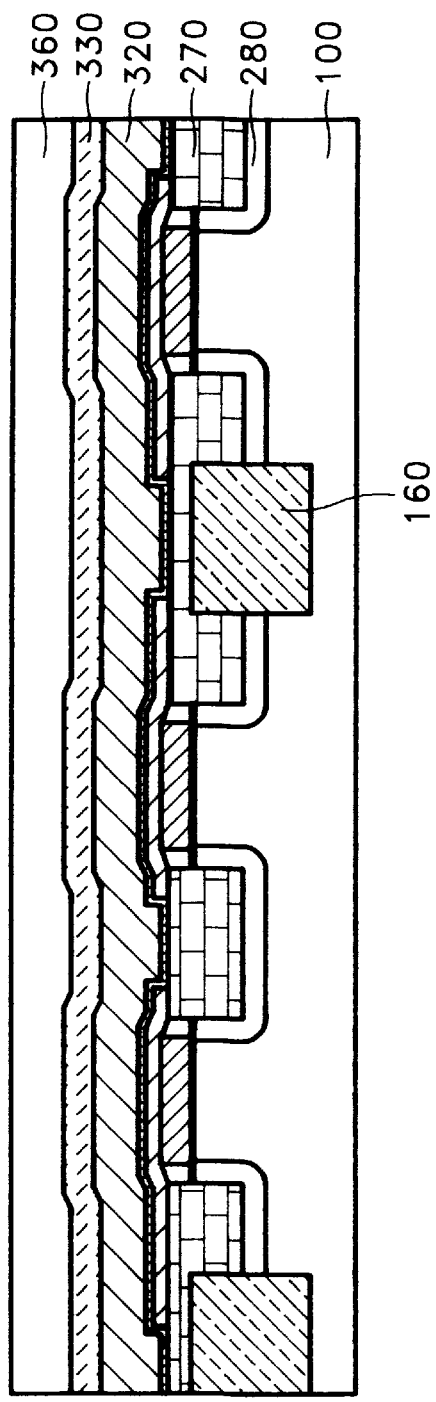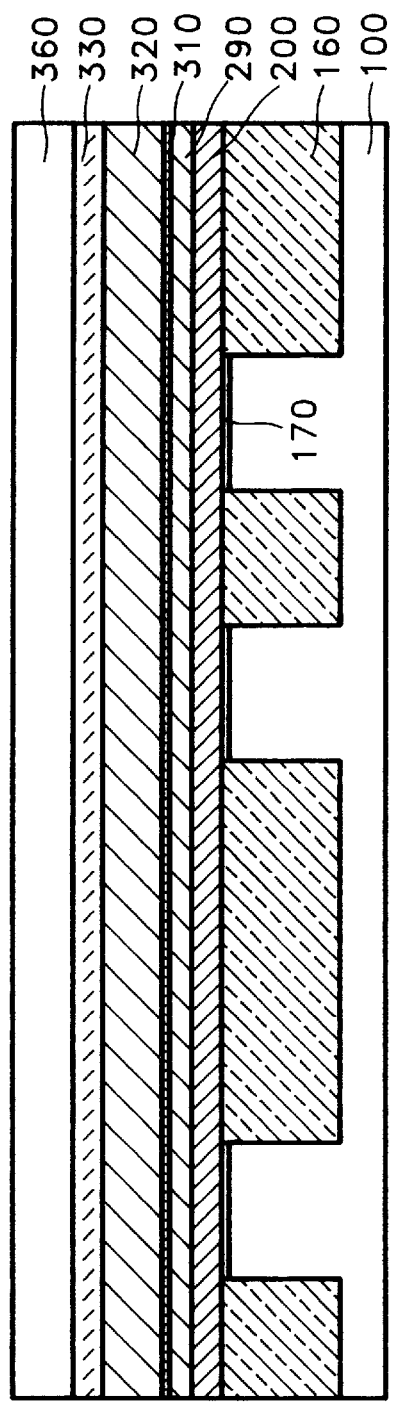

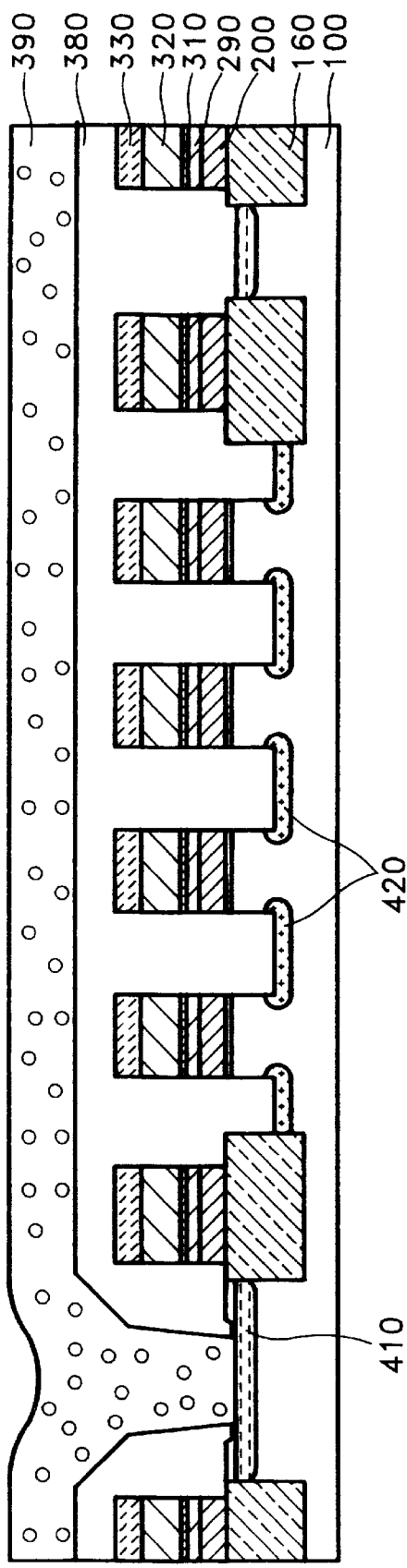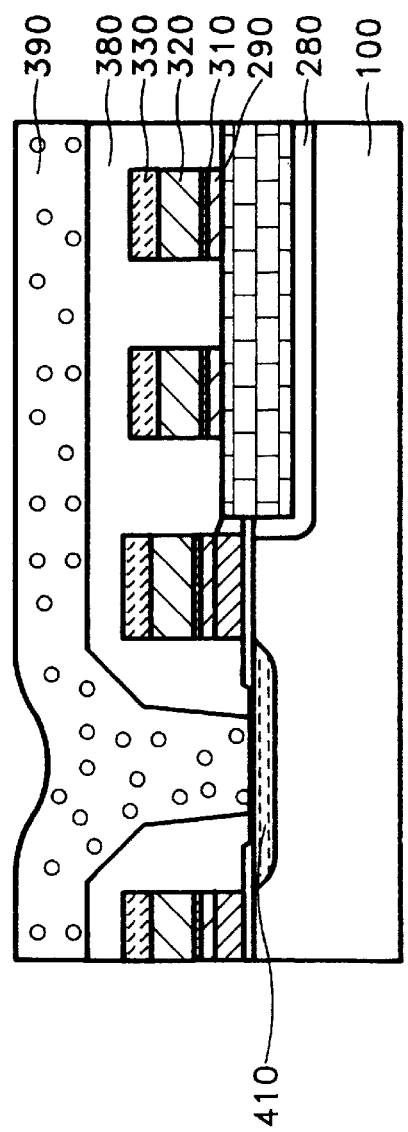

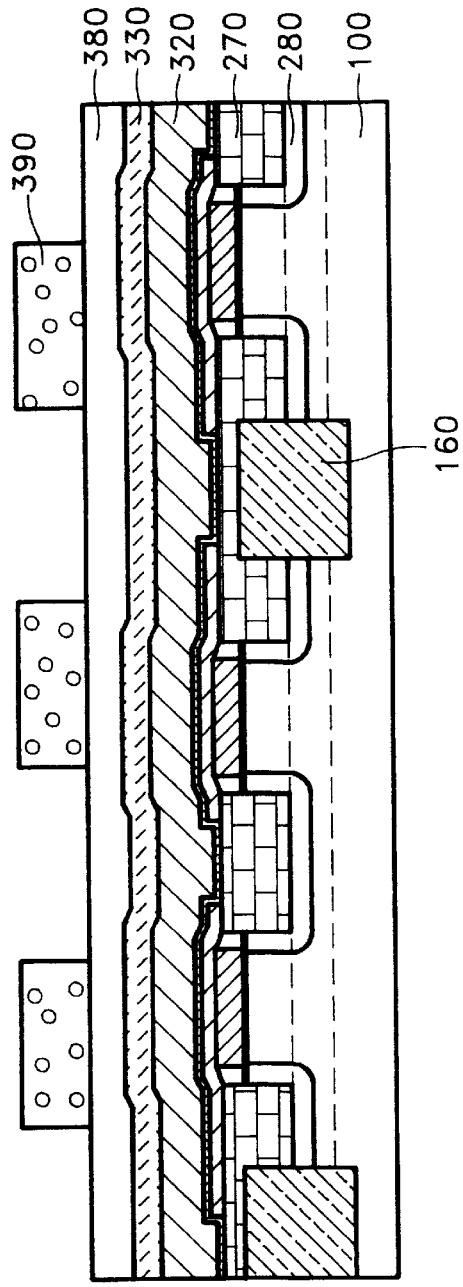
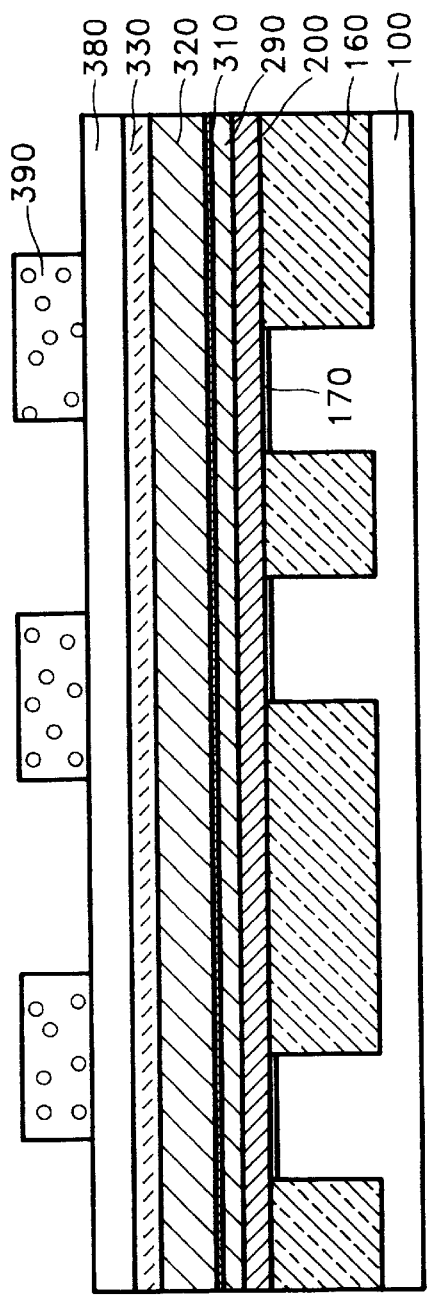
FIG. 21C
FIG. 21D

FLASH MEMORY DEVICE AND MANUFACTURING METHOD THEREFOR

This application is a continuation-in-part of U.S. application Ser. No. 08/685,458, filed Jul. 19, 1996.

BACKGROUND OF THE INVENTION

The present invention relates to a flash memory device and a manufacturing method therefor, and more particularly, to a flash memory device capable of maintaining stable operation having a cell which is appropriate for high-integration, and to a manufacturing method therefor.

There are various types of semiconductor memories. In a random access memory (RAM) device, information is lost when power is shut off, and in a read only memory (ROM) device, information is retained even though power is shut off. Accordingly, the ROM device is called a nonvolatile memory. Here, a flash memory device of the nonvolatile type in which information can be electrically erased or written has been widely used for a computer and a memory card.

Various kinds of cells are employed in the flash memory device. Here, in a simple stacked-gate type cell, which is disclosed in IEDM, pp. 616–619, 1985, a memory cell includes one transistor formed of a source and drain and a gate electrode having both a floating gate and a control gate. The floating gate stores data and the control gate controls the floating gate. Operations of the simple stacked-gate type cell are divided into three types, i.e., an erase operation for moving electrons of the floating gate to the source and drain and a bulk, thereby lowering the threshold voltage of the cell, a program operation for implanting hot electrons generated from a channel region into the floating gate, using gate electric potential and drain electric potential higher than source electric potential, thereby increasing the threshold voltage of the cell, and a read operation for reading the erasure state and the program state of the cell. The above simple stacked-gate type cell has structural and operational problems.

As for the operational problems, since programming is performed by injecting hot electrons, the cell characteristic, i.e., endurance is rapidly deteriorated during cycling of the erasure and program operations, and disturbance occurs in the cells which were not selected during programming or reading. As a consequence, when excessive erasion occurs in a cell, in other words, the threshold voltage of the cell is less than 0 V, it is very difficult to solve the problem.

As for the structural problems, though one transistor forms one cell, a bit-line contact connected to a drain is necessary for two cells, to thereby make high-integration difficult. Also, since sources of the cell are commonly connected in an active region, a phenomenon of corner rounding due to bird's beak occurs during oxidation for forming a field oxide film. Accordingly, distribution of the threshold voltage of the cell after the erase and program operations is increased, which causes difficulties in enhancing the integration.

In order to solve the above problems of the simple stacked-gate type cell, first, a divided bit line NOR (DINOR) cell has been proposed in IEDM, pp. 599–602, 1992, and IEEE JOURNAL OF SOLID-STATE CIRCUITS, VOL29, NO.4, pp.454–457, 1994. Here, referring to FIGS. 1 and 2, the DINOR cell and operation conditions thereof will be described as follows.

FIGS. 1 and 2 are schematic and sectional views, respectively, of a conventional flash memory having a DINOR cell.

In detail, the DINOR cell includes word lines W/L1 to W/Li for selecting a desired cell transistor, a select transistor line 3 having a select transistor 3a, a main bit line 1 connected to a drain of said select transistor 3a of said select transistor line 3, and a sub bit line 5 connected to a source of the select transistor 3a and formed of a polysilicon film.

In general, a string in which drains of each memory cell are connected in parallel to each other through the sub bit line 5 and cell transistors are arranged in series, is connected to an adjacent string through a source line 7. Reference character "A" of FIG. 1 represents a unit block of a DINOR cell which includes one select transistor 3a, eight memory cells, and one sub bit line 5 connected to the main bit line 1 through the select transistor 3a.

During operation of the DINOR cell, the erase operation is performed by applying a voltage of approximately 10 V to the control gate of the memory cell and a voltage of approximately −8 V to the source and a P-well (bulk), and then Fowler-Nordheim (F-N) tunneling electrons of the bulk to the floating gate, thereby increasing the threshold voltage to 6~7 V. The program operation is performed by applying a negative voltage of approximately −8 V to the control gate and a voltage of 5 V to the bit line, and then F-N tunneling electrons of the floating gate to the drain of the cell, thereby reducing the threshold voltage of the cell. The DINOR cell having the above-mentioned structure and operation has problems as follows.

First, the flash memory device having the DINOR cell requires a complicated manufacturing process and many mask steps. That is, since this is manufactured by additionally applying techniques of a self-aligned source, a self-aligned bit line contact, and a tungsten plug to the simple gate type cell, the number of processes using a mask increases. Also, during formation of the self-aligned bit line contact and sub bit line formed of a polysilicon film, a stringer is generated, to thereby deteriorate yield. Besides, in the self-aligned source technique, during etching a thick field oxide film, the surface of a silicon substrate is damaged, to thereby generate leakage current. Thus, the cell characteristics during operation are deteriorated.

Since the sources of the cell are commonly connected in a word line direction, resistance of the source line increases and further, a particular circuit for decoding the source is necessary. That is, a row decoder becomes complicated and an area increases.

Meanwhile, in order to solve the above problems of the simple stacked-gate type cell, an AND cell has been proposed in IEDMs, pp. 991–993, 1992 and pp. 921–923, 1994. Referring to FIGS. 3 and 4, the AND cell and operation conditions thereof will be described as follows.

FIG. 3 is a schematic view of a conventional flash memory having an AND cell, and FIGS. 4A and 4B are sectional views taken along a word line and a bit line of the AND cell of FIG. 3.

In detail, a unit block B of the AND cell includes a plurality of memory cells connected in parallel to each other, a local data line 11 for connecting drains of the memory cells, a local source line 13 for connecting sources of the memory cell, two select transistor lines ST1 and ST2 for selecting the local source line 13 and the local data line 11, a global data line connected to the select transistor line ST1 and a common source line 16 connected to the select transistor line ST2.

In particular, in the AND cell, the local source line 13 and local data line 11 are formed of a buried $N^+$ diffusion layer. That is, the AND cell has no contact and does not require the area and the process for forming the bit line which are required for the above-mentioned DINOR structure. A floating gate 17 is formed of two polysilicon layers, and channels of the cell are separated by a junction layer 25 self-aligned by ion-implantation as shown in FIG. 4B. Reference numerals 19 and 21 of FIGS. 4A and 4B indicate a word line and an insulating layer, respectively.

Next, during operation of the AND cell, the erase operation is performed by applying a voltage of 0 V to the bulk, source and drain and 13 V to the control gate, and then F-N tunneling electrons of the bulk to the floating gate, thereby increasing the threshold voltage of the cell to 6–7 V. The program operation is performed by applying a negative voltage of approximately −9 V to the control gate and 3 V to the drain of the cell, and then F-N tunneling electrons of the floating gate to the drain, thereby reducing the threshold voltage to 1–2 V. The AND cell having the above-mentioned structure and operation conditions has problems as follows.

Here, various cells connected in parallel and running parallel to the bit line (global data line) increase integration. However, as shown in FIGS. 4A and 4B, in a word line direction, two buried N⁺diffusion layers 23a and 23b used for the source and drain, a channel region and a field insulating layer 27 are necessary within an area using one bit line. In other words, the field insulating layer 27 should be formed in an area of one bit line 15, which greatly limits integration. Also, as integration increases, resistance components of the buried N⁺diffusion layers 23a and 23b increase, and thus deteriorates the characteristics of the cell.

Meanwhile, in order to solve the above problems of the simple stacked-gate type cell, a high capacitance-coupling ratio (HiCR) cell has been proposed in IEDM, pp. 19–22, 1993. Referring to FIGS. 5 and 6, the HiCR cell and operation conditions thereof will be described.

FIG. 5 is a schematic of a conventional flash memory device having the HiCR cell.

Referring to FIG. 5, the HiCR cell includes a plurality of word lines W1–W32 arranged horizontally, a bit line 31 arranged vertically, a first select transistor line 33 connected to a main bit line 31 and having a first select transistor, a sub bit line 41 connected to drains of the memory cells, a sub source line 35 for commonly connecting sources of the memory cells, a second select transistor line 37 connected to the sub source line 35 having a second select transistor, and a main source line 39 connected to the second select transistor. Here, the main source line 39 and the main bit line 31 are formed of metal lines.

FIG. 6 is a sectional view of a conventional flash memory device having the HiCR cell.

Referring to FIG. 6, the HiCR cell includes a first polysilicon layer 59 as a floating gate formed on a thick gate oxide film 51, a tunneling oxide film 55 below the first polysilicon layer 59, a buried junction layer 57 acting as the source and drain of the memory cell, an insulating layer 61 located on the first polysilicon layer 59 and a second polysilicon layer 63 as a control gate. Both the program and erase operations of the flash memory device having a HiCR cell structure are performed by F-N tunneling through a tunneling oxide film. The flash memory device having the above HiCR cell structure has problems as follows.

First, integration of the cell in a word line direction is limited. That is, since a memory cell area of two bit lines requires three metal lines which include two bit lines and one main source line, it is difficult to increase the integration. Second, since a tunneling oxide film 55 is formed on the high-density buried junction layer 57, quality of the tunneling oxide film is deteriorated and further reliability of a device is deteriorated.

SUMMARY OF THE INVENTION

Accordingly, it is an object of the present invention to provide a flash memory device having a cell capable of maintaining stable operation and which is appropriate for high-integration.

It is another object of the present invention to provide a method for manufacturing a flash memory device.

To accomplish the first object of the present invention, there is a flash memory device comprising: a semiconductor substrate of a first conductive type; a field insulating layer buried in a first trench formed in the semiconductor substrate in order to define an active region; a tunnel insulating film formed on the active region; a first conductive layer for a floating gate formed on the tunnel insulating film; spacers formed on both the tunnel insulating film and the sidewalls of the first conductive layer; a buried insulating layer buried in a second trench formed by etching the substrate adjacent to the spacers; a buried junction layer contacting a lower portion and sidewalls of the buried insulating layer, and acting as a source and drain region including impurities of a second conductive type; a second conductive layer formed on the first conductive layer and connected to the first conductive layer to be used as a floating gate; an insulating layer formed on the second conductive layer; and a third conductive layer for a control gate formed on the insulating layer.

Preferably, the insulating layer is formed of a composite film of oxide /nitride/oxide film (ONO film). Also, the first and second conductive layers are formed of a polysilicon film.

Preferably, the first conductive type is a P-type and the second conductive type is an N-type. Also, an n-well is formed in the semiconductor substrate, and a p-well is formed in the n-well.

Preferably, the depth of the first trench is deeper than that of the second trench.

To accomplish the first object of the present invention, there is provided a flash memory device comprising: a semiconductor substrate of a first conductive type; a field insulating layer buried in a trench formed on the semiconductor substrate of a first conductive type in order to define an active region; a tunnel insulating film formed on the active region; first and second conductive layers for a floating gate sequentially formed on the tunnel insulating film and field insulating film; an insulating layer formed on the second conductive layer; a third conductive layer for a control gate formed on the insulating layer; a first impurity layer for cell channel stop formed of impurities of a first conductive type on the semiconductor substrate between first conductive layers formed on the tunnel insulating film ; and a second impurity layer for a source/drain of a select transistor of a second conductive type, formed opposite to the first conductive type, on the semiconductor substrate between the first conductive layers formed on the field insulating layer.

Preferably, the first conductive type is a P-type and the second conductive type is an n-type. Also, an n-well is formed in the semiconductor substrate, and a p-well is formed in the n-well.

To accomplish the first object of the present invention, there is provided a flash memory device comprising: a semiconductor substrate of a first conductive type; a field insulating layer buried in a first trench formed on the semiconductor substrate of a first conductive type in order to define an active region; a tunnel insulating film formed on the active region; first and second conductive layers for a floating gate sequentially formed on the tunnel insulating film and field insulating layer; an insulating layer formed on the second conductive layer; a third conductive layer for a control gate formed on the insulating layer; a first impurity layer for cell channel stop formed of impurities of a first conductive type in a lower portion of a second trench formed by etching the semiconductor substrate between the first conductive layers formed on the tunnel insulating layer; and a second impurity layer for a source and drain of a select transistor formed of a second conductive type, opposite to the first conductive type, formed on the semiconductor substrate between the first conductive layers formed-on the field insulating layer.

Preferably, the first conductive type is a P-type, and the second conductive type is an N-type. Also, an n-well is formed on the semiconductor substrate, and a p-well is formed in the n-well.

Preferably, the trench is deeper than that of the second trench.

To accomplish the second object of the present invention, there is provided a manufacturing method of a flash memory device comprising the steps of: a) forming a first insulating film on a semiconductor substrate of a first conductive type; b) etching the first insulating layer and a predetermined region of the substrate, thereby forming a first trench; c) forming a field insulting film for filling the trench, thereby defining an active region; d) removing the first insulating layer; e) forming a second insulating film on the entire surface of the field insulating film and substrate; f) etching the second insulating film, thereby forming a gate insulating film; g) forming a tunnel insulating film, a first conductive layer and a third insulating film on the entire surface of a substrate where the gate insulating film is formed; h) etching a predetermined area of the third insulating film and first conductive layer; I) forming spacers on sidewalls of the etched third insulating layer and first conductive layer; j) etching the substrate using the spacers as a mask, thereby forming a second trench; k) ion-implanting impurities of a second conductive type on the entire surface of a substrate having the second trench; 1) forming a buried insulating layer formed in the second trench and buried junction layer for a source and drain of a memory cell contacting with the the lower portion of the buried insulating layer; m) forming a second conductive layer on the entire surface of a substrate where the first conductive layer is formed; n) etching the second conductive layer, thereby forming a floating gate formed of a second conductive layer and a first conductive layer; and o) forming a fourth insulating layer and a third conductive layer for a control gate on the entire surface of a substrate where the second conductive layer is formed.

Preferably, after the step b), a step of ion-implanting for channel stop into the entire surface of a substrate where the first trench is formed, is further comprised.

Also, it is preferable that after the step o), steps of: forming a fifth insulating layer on the third conductive layer; patterning the fifth insulating layer, thereby forming a fifth insulating layer pattern; etching the third conductive layer, the fourth insulating layer, the second conductive layer and the first conductive layer using the fifth insulating layer pattern as a mask, thereby forming a plurality of word lines, string select lines and ground select lines; forming an impurity layer for cell channel stop on the semiconductor substrate between the word lines according to ion-implantation; forming an impurity layer for a source and drain of a select transistor on the semiconductor substrate between the word line and the string select line and between the word line and the ground select line; forming an interdielectric layer having a contact hole exposing the impurity layer for source and drain of the transistor; and forming bit lines connected to the contact hole, are further comprised.

It is preferable that after the step o), steps of: forming a fifth insulating layer on the third conductive layer; patterning the fifth insulating layer, thereby forming a fifth insulating layer pattern; etching the third conductive layer, fourth insulating layer, second conductive layer and first conductive layer using the fifth insulating layer pattern as a mask, thereby forming a plurality of word lines, string select lines and ground select lines; forming an impurity layer for a source and drain of a select transistor on the semiconductor substrate between the word line and the string select line and between the word line and the ground select line; etching the semiconductor substrate between the word lines, thereby forming a third trench; forming an impurity layer for cell channel stop on a lower portion of the third trench according to ion-implantation; forming an interdielectric layer having a contact hole for exposing the impurity layer for source and drain of a select transistor; and forming a bit line connected to the contact hole are further comprised.

Preferably, the first and second conductive layers are formed of a polysilicon film. Also, the first conductive type is a P-type, and the second conductive type is an N-type.

Preferably, the first trench is deeper than that of the second trench.

Accordingly, the flash memory device of the present invention can maintain stable operation and is appropriate for high integration.

BRIEF DESCRIPTION OF THE DRAWINGS

The above object and advantages of the present invention will become more apparent by describing in detail a preferred embodiment thereof with reference to the attached drawings in which:

FIG. 9A through 18A, 9B through 18B, 9C through 18C and 9D through 18D are sectional views showing a manufacturing method of a flash memory device according to an embodiment; and FIGS 19A through 21A, 19B through 21B, 19C through 21C and 19D through 21D are sectional views showing a manufacturing method of a flash memory according to another embodiment.

DETAILED DESCRIPTION OF THE INVENTION

A cell proposed by the present inventor is called a dual string NOR (DuSNOR).

Figure 1:
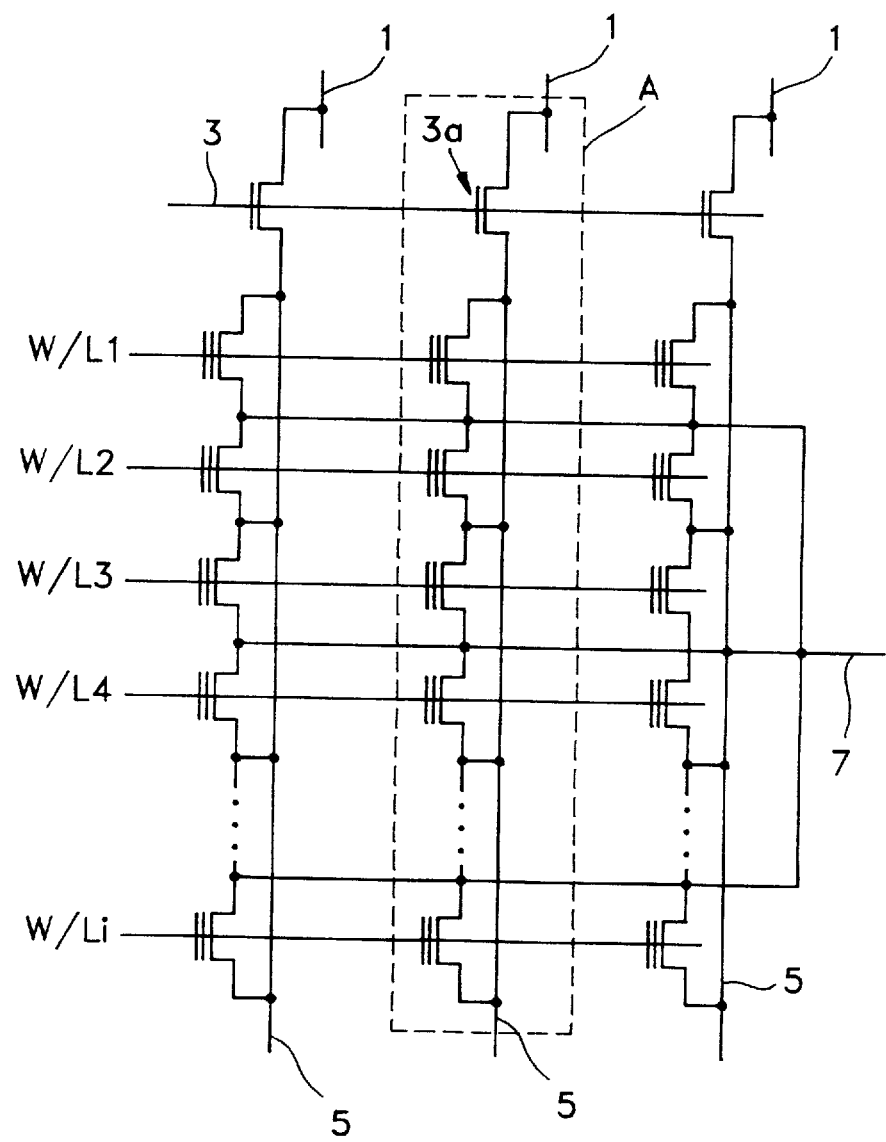
FIGS. 1 and 2 are schematic and sectional views, respectively, of a conventional flash memory device having a DINOR cell.
Figure 2:
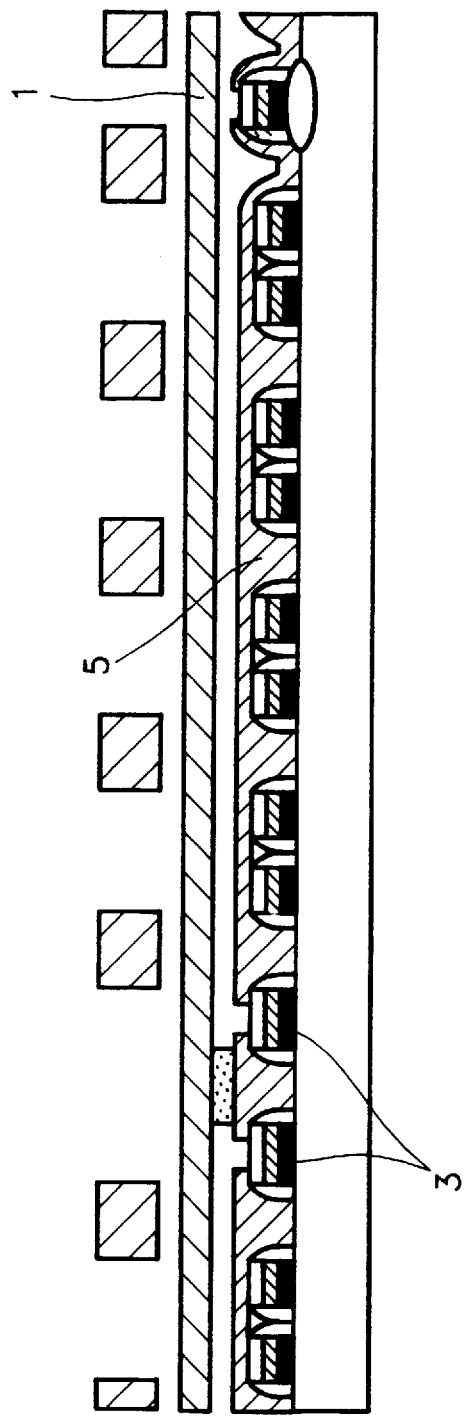
Figure 3:
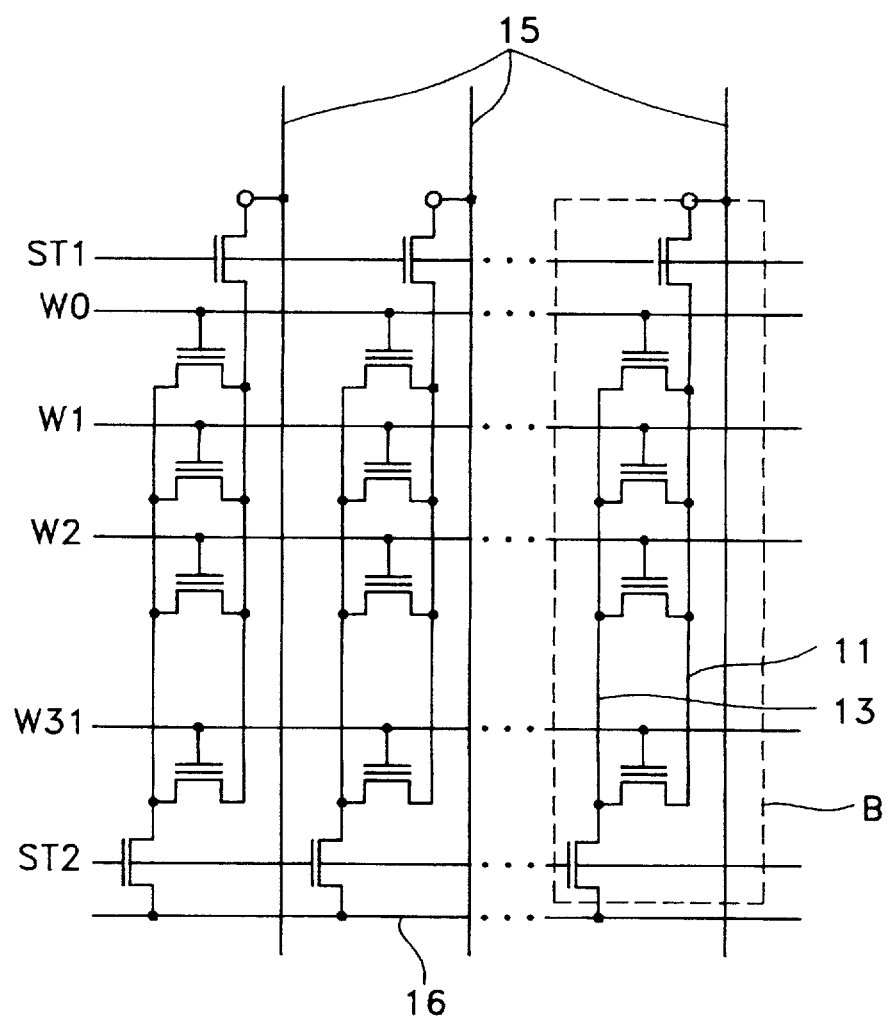
FIG. 3 is a schematic of a conventional flash memory device having an AND cell.
Figures 4A, 4B:
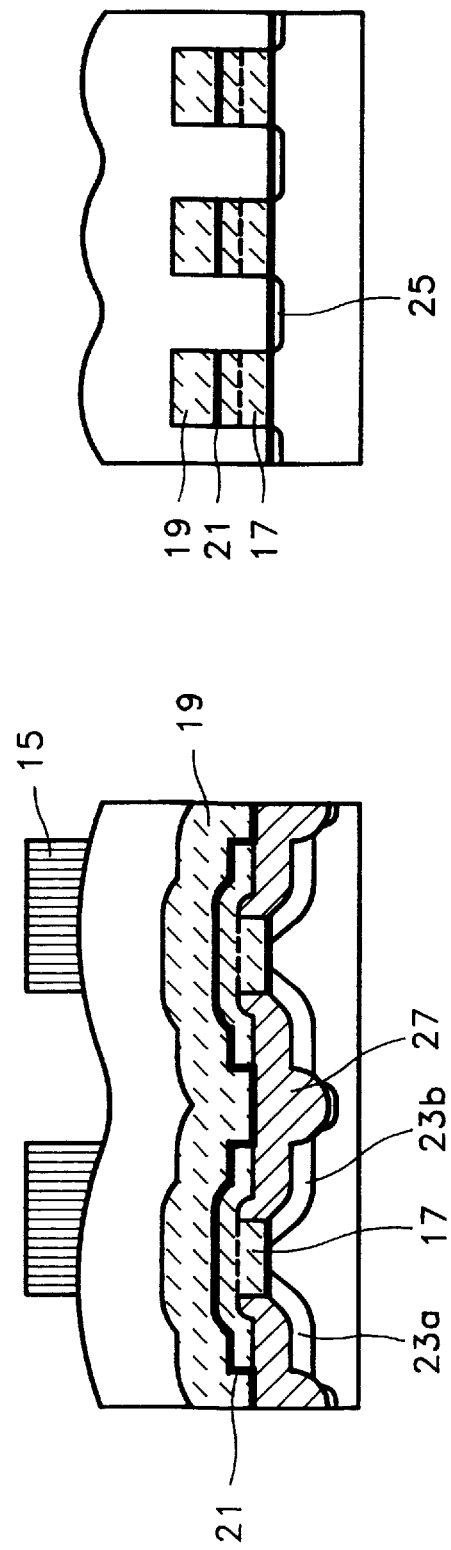
FIGS. 4A and 4B are sectional views taken along a word line and a bit line of the AND cell of FIG. 3.
Figure 5:
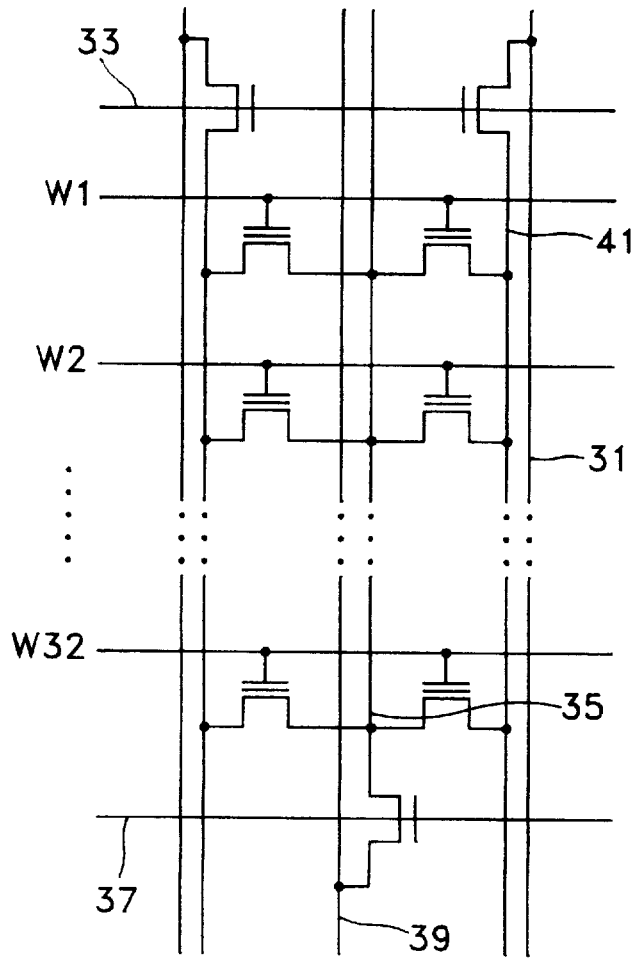
FIGS. 5 and 6 are schematic and sectional views, respectively, of conventional flash memory device having a HiCR cell.
Figure 6:
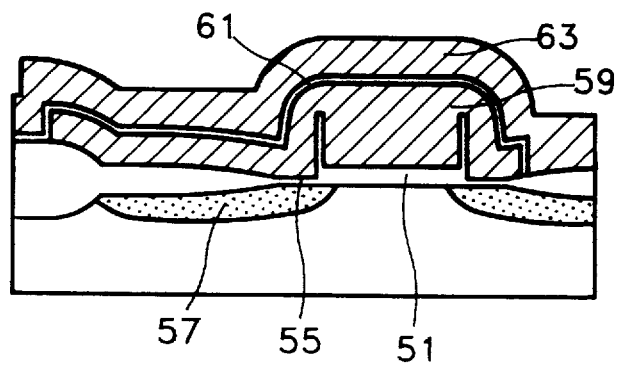
Figure 7:
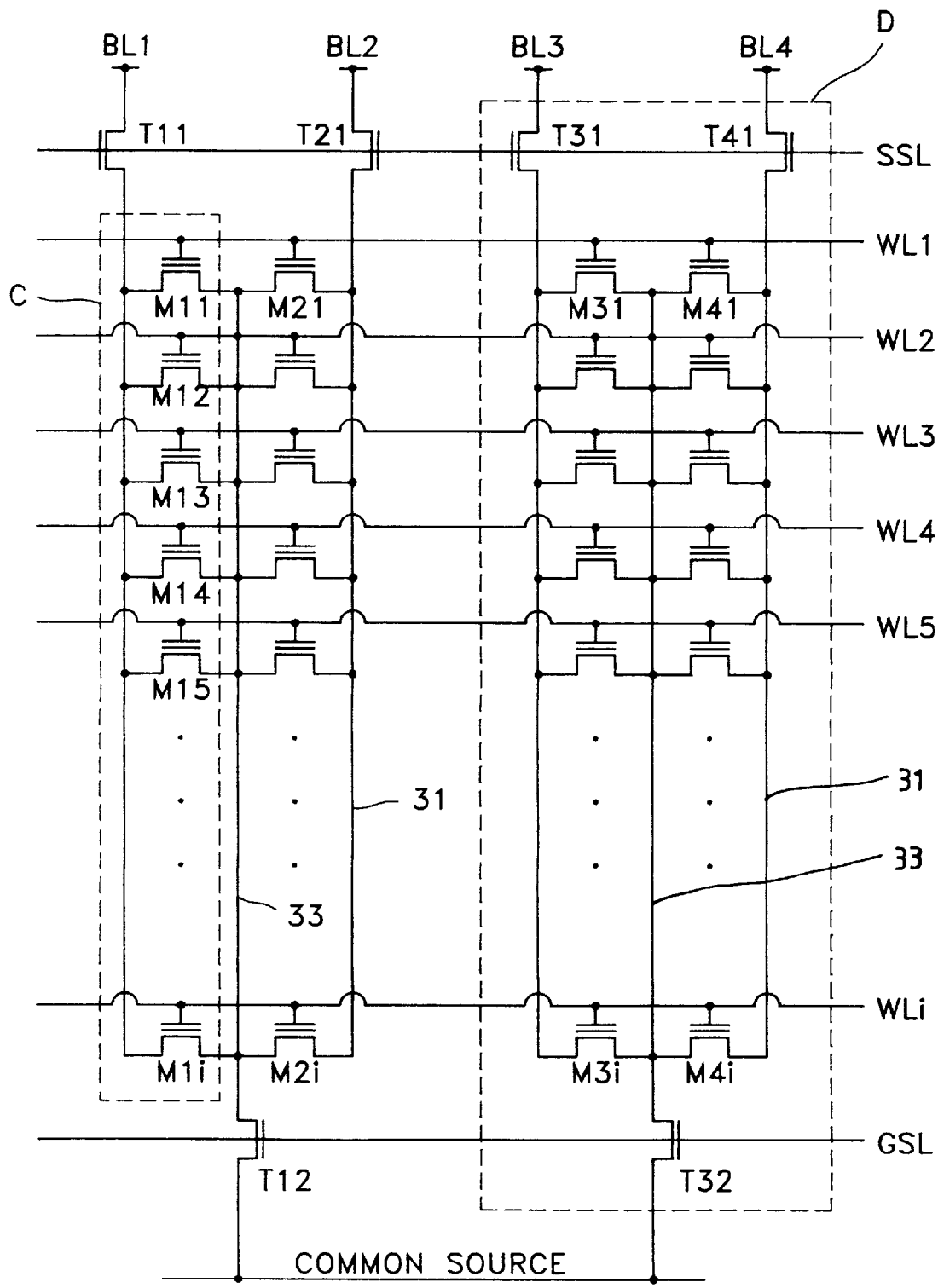
FIG. 7 is a schematic of a flash memory device having a DuSNOR cel according to the present invention.

Referring to FIG. 7, a flash memory device having the DuSNOR cell includes word lines W/L1 through W/Li for selecting a desired memory cell, a string C in which various memory cells are connected in parallel, string select transistors T11, T21, T31 and T41 for selecting the string C, a string select line SSL for connecting the string select transistors T11, T21, T31 and T41, a drain line 31 for connecting the memory cells in parallel, a source line 33 for connecting two strings through the source of the memory cell, ground select transistors T12 and T32 for selecting the source line 33, a ground select line GSL for connecting the ground select transistors T12 and T32 to bit lines BL1 to BL4 which are connected to drains of the string select transistors T11, T21, T31 and T41. Here, reference character D indicates a unit block.

In the DuSNOR cell of the unit block D according to the present invention, sources of the string select transistors T31 and T41 are connected to drains of each memory cell through the drain line 31, and sources of the memory cells are connected to a drain of the ground select transistor T32 through the source line 33, and further a source of the ground select transistor T32 is connected to a common source to be commonly connected to a source of the ground select transistor T12 adjacent thereto.

Figure 8:
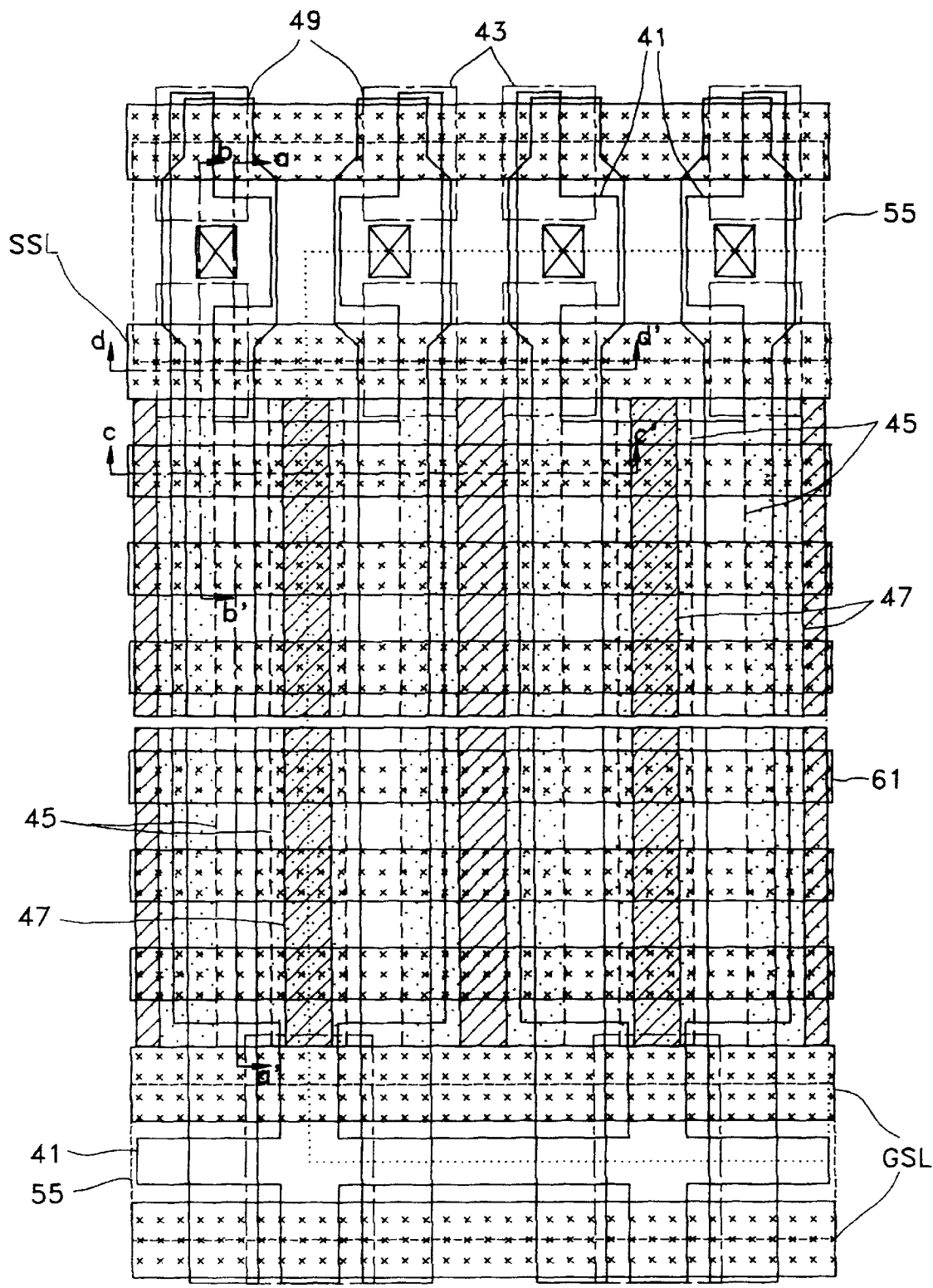
FIG. 8 is a layout of the flash memory device having the DuSNOR of FIG. 7.
Figure 9A:
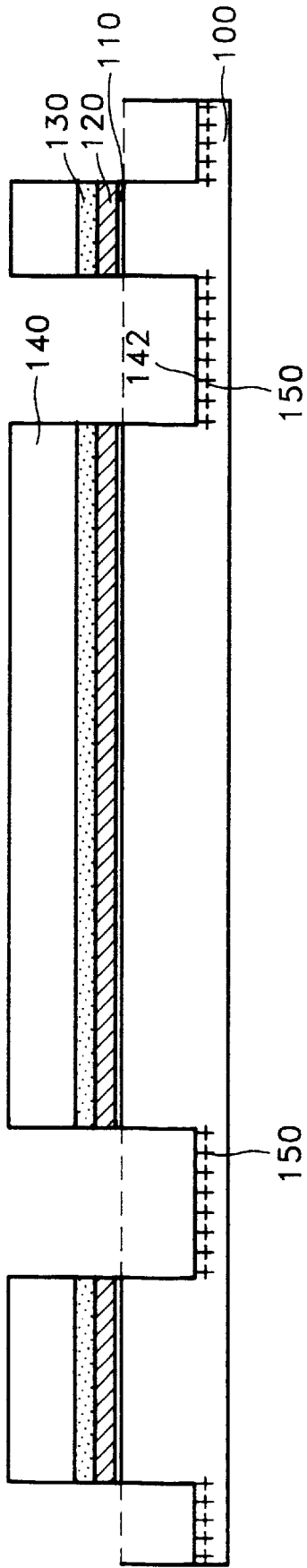
Figure 9B:
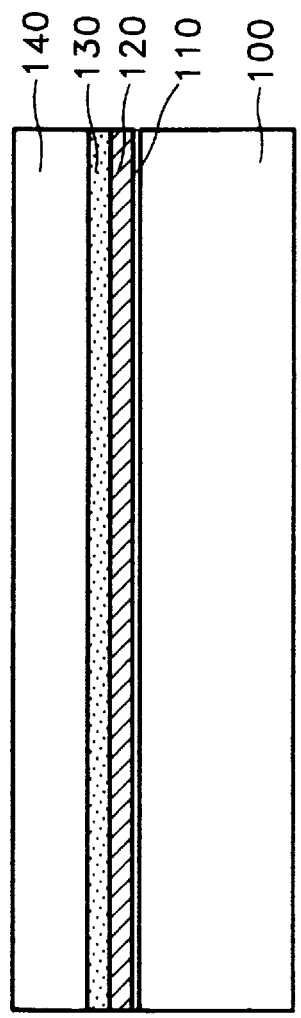
Figure 11A:
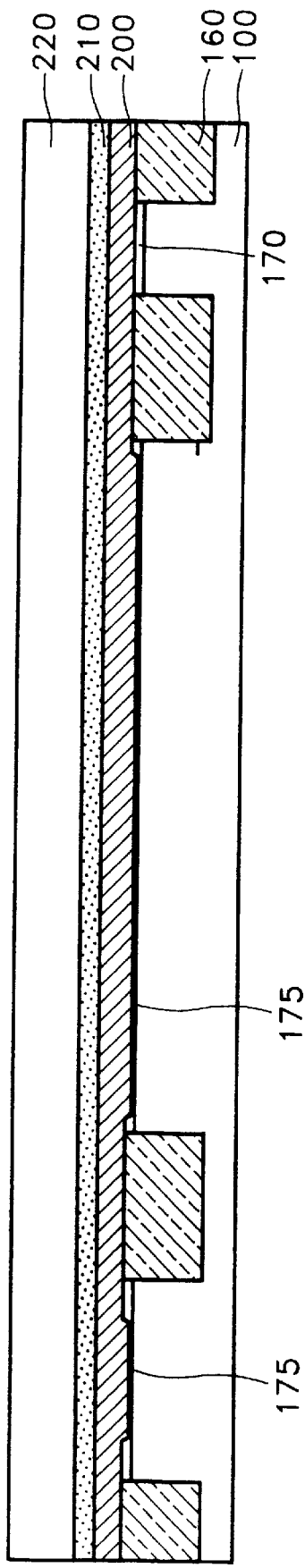
Figure 11B:
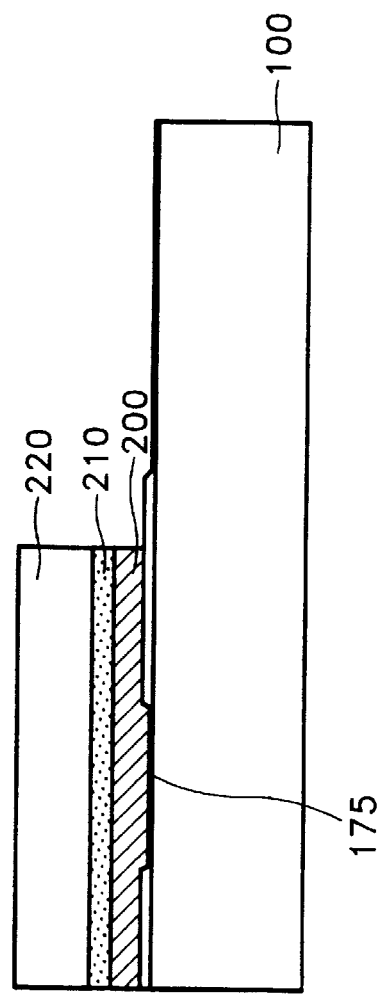
Figure 11C:
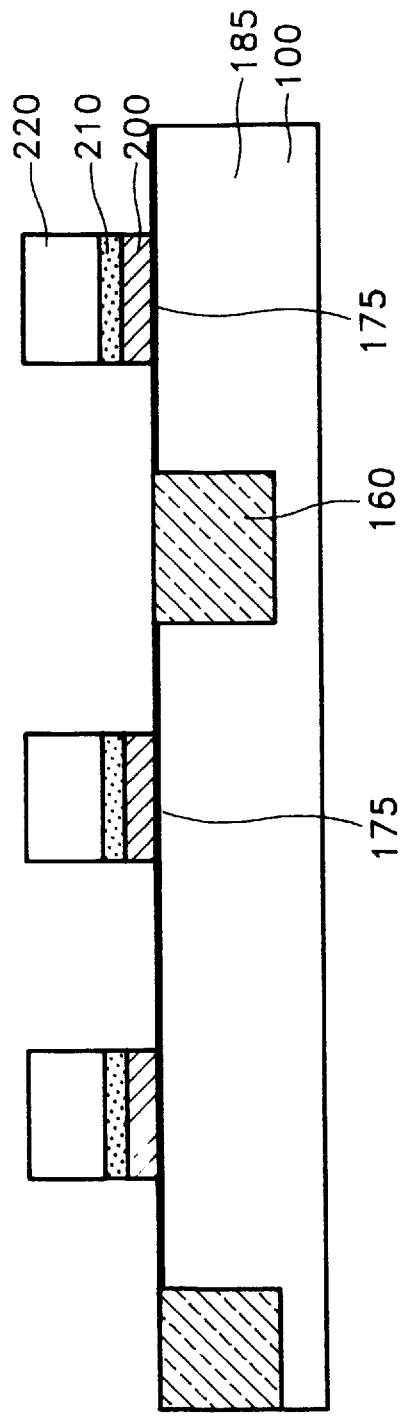
Figure 11D:
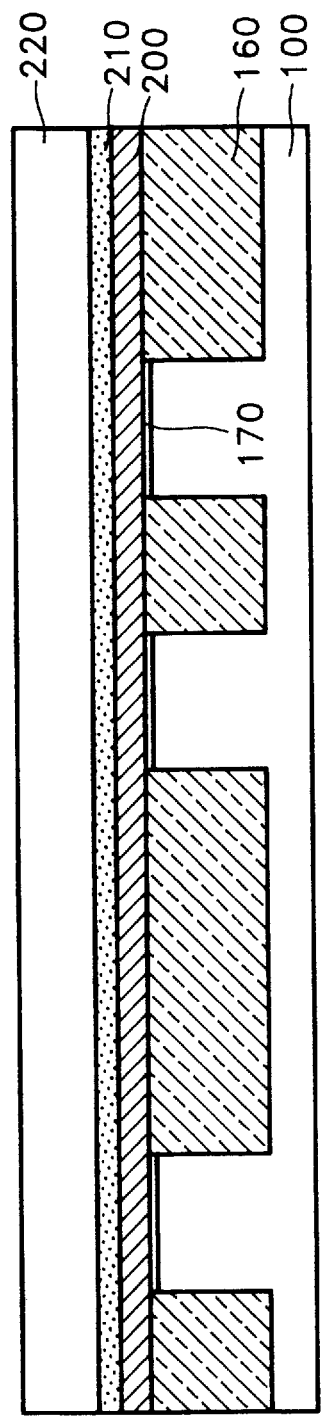
Figure 12C:
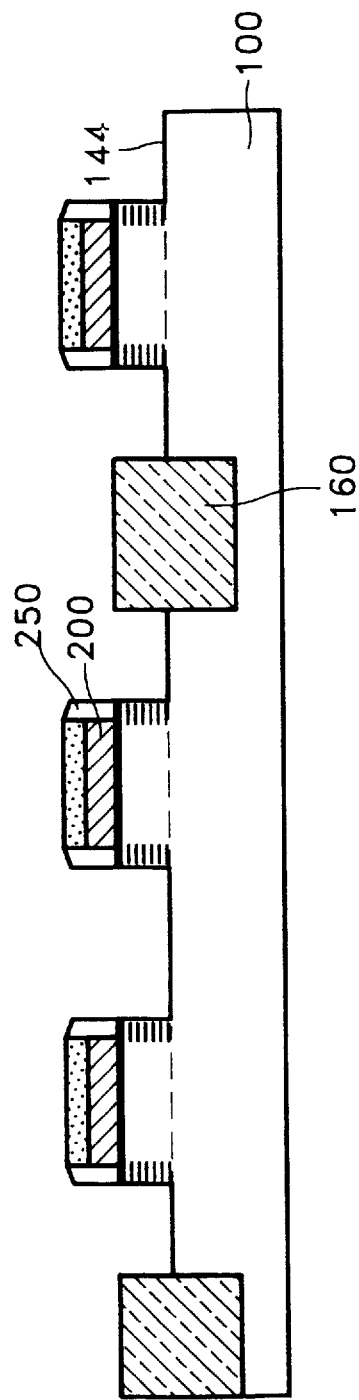
Figure 12D:
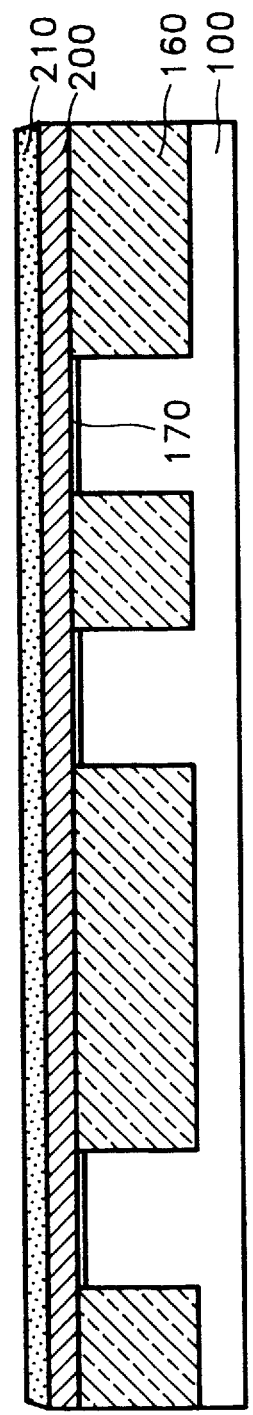
Figure 13C:
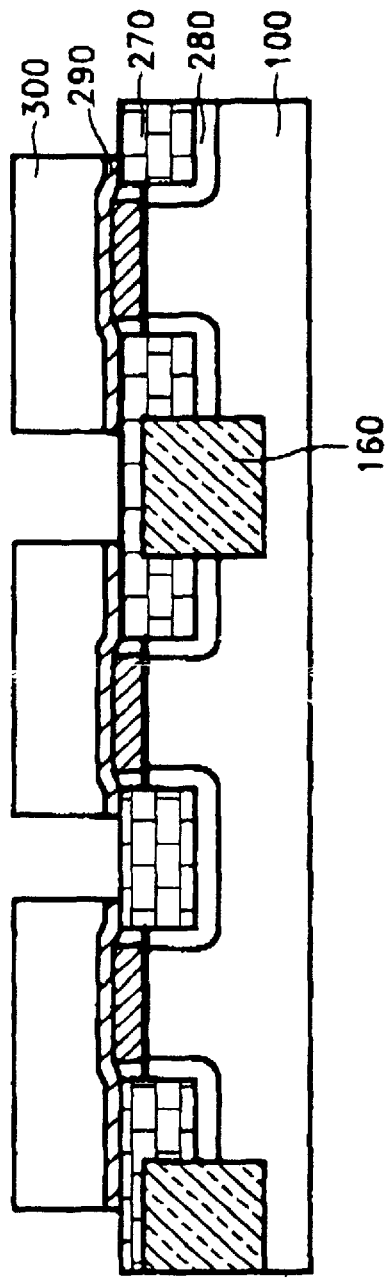
Figure 13D:
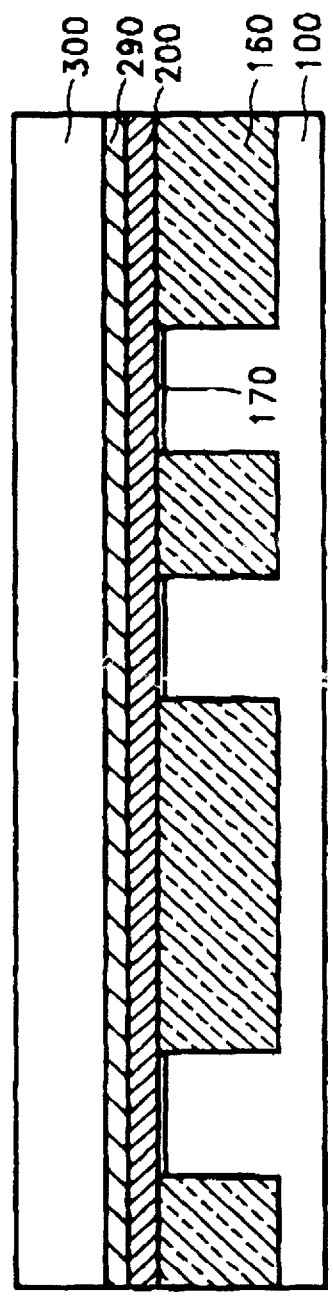
Figure 14A:
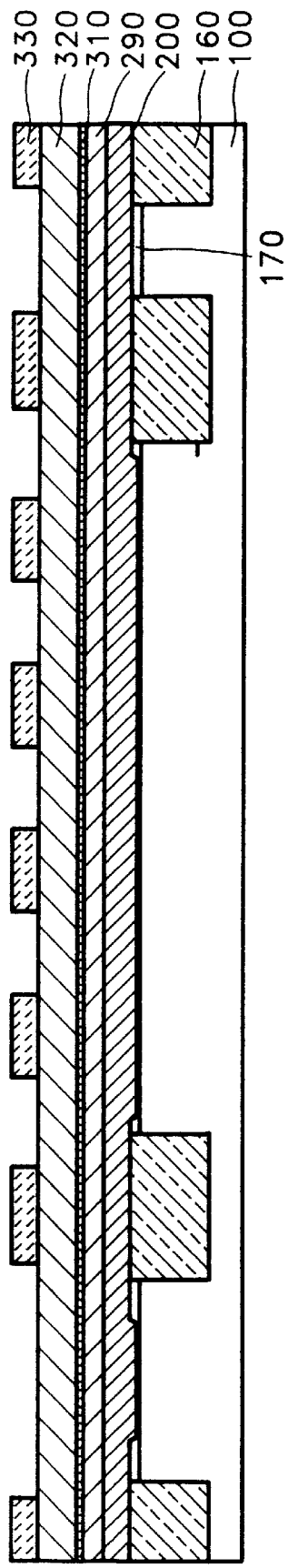
Figure 14B:
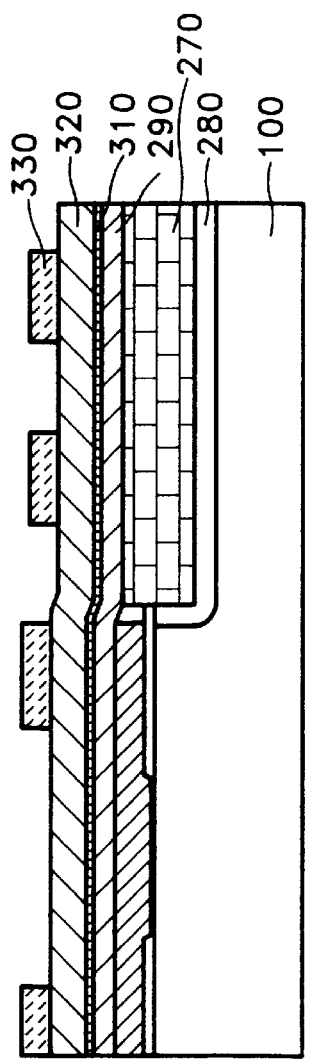
Figure 15A:
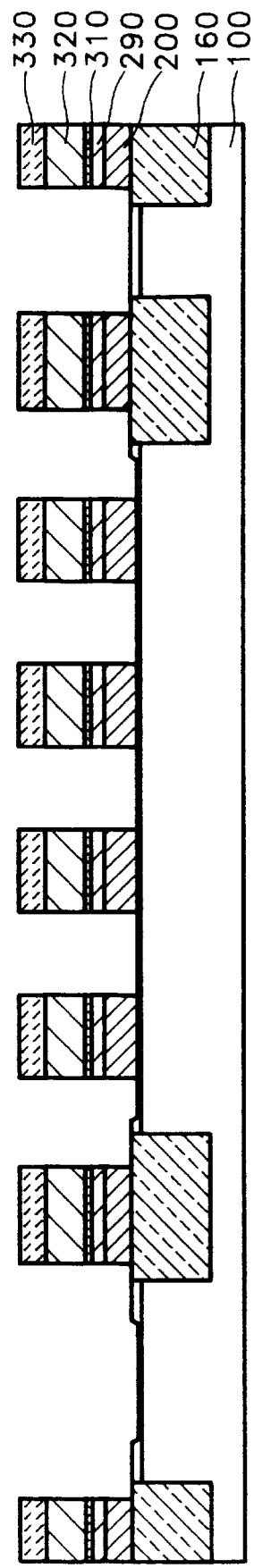
Figure 15B:
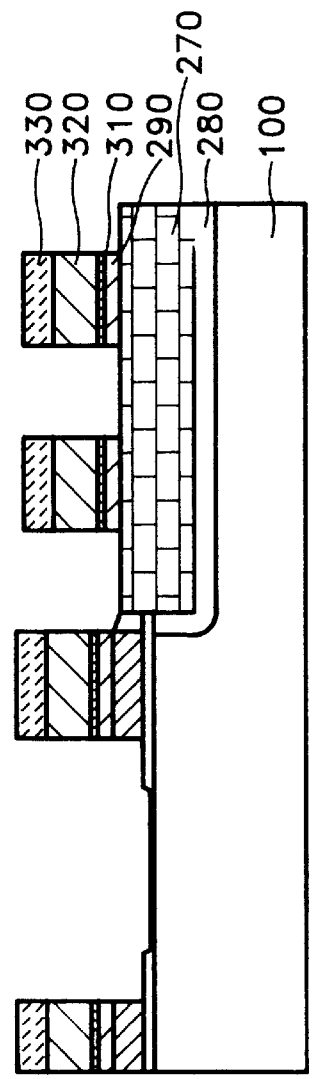
Figure 15C:
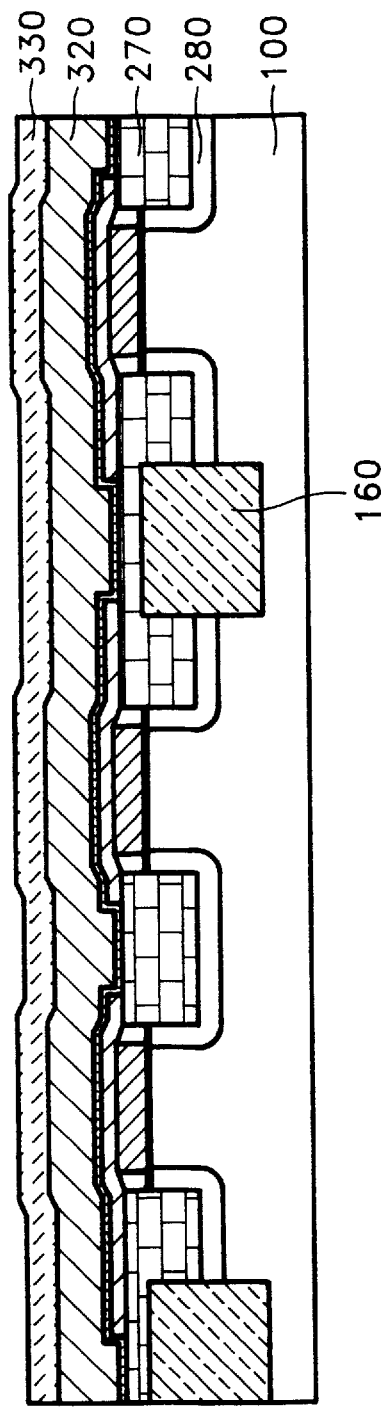
Figure 15D:
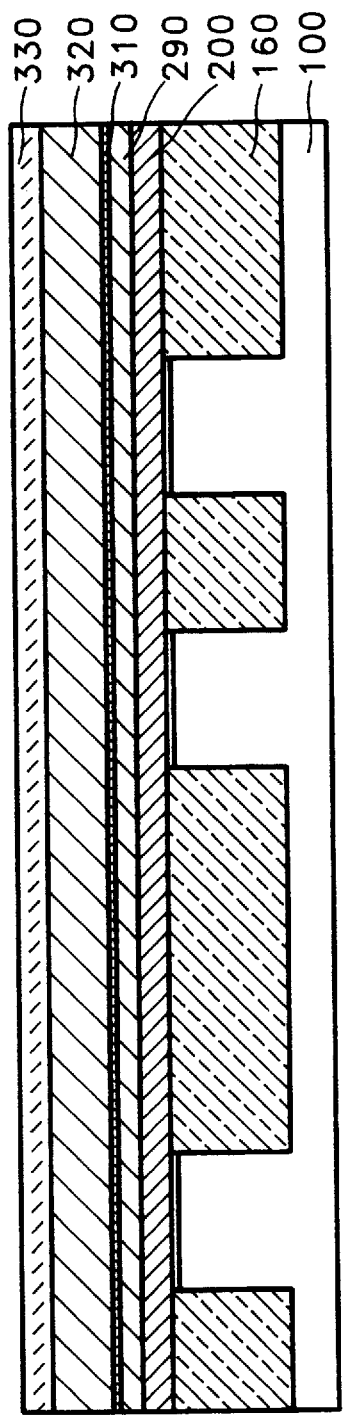
Figure 16A:
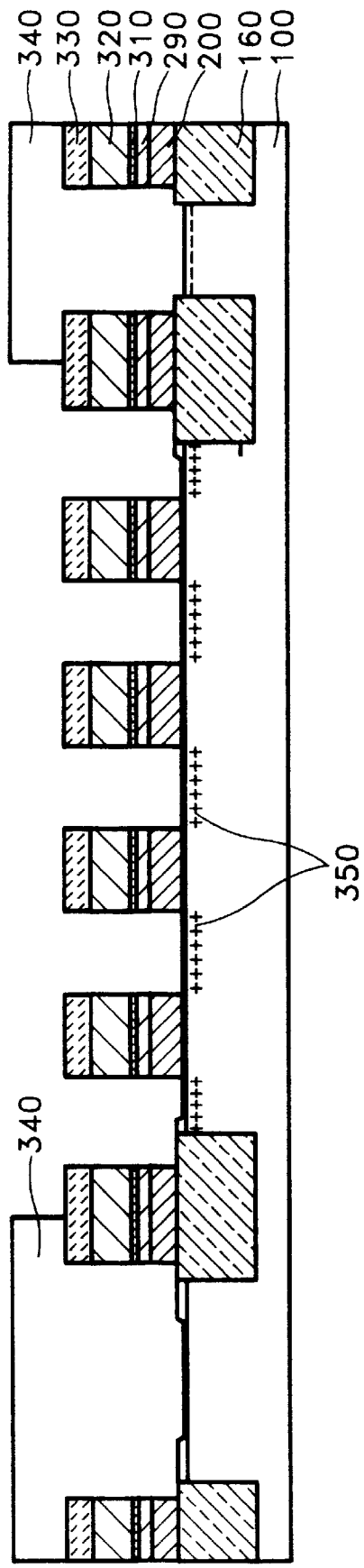
Figure 16B:
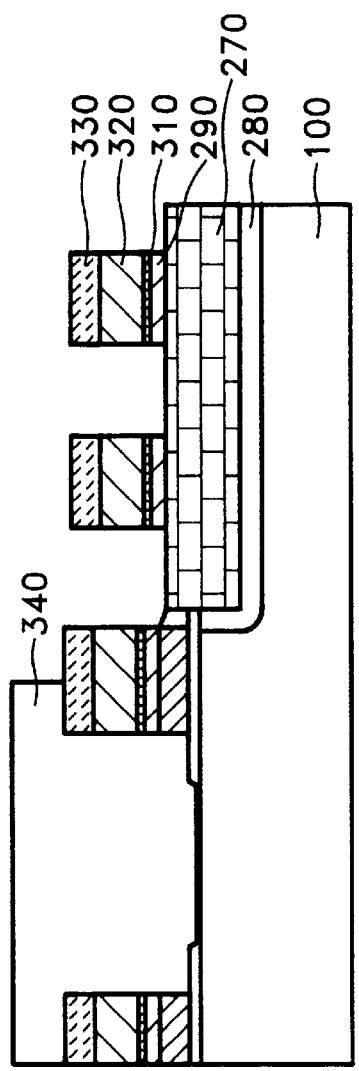
Figure 17A:
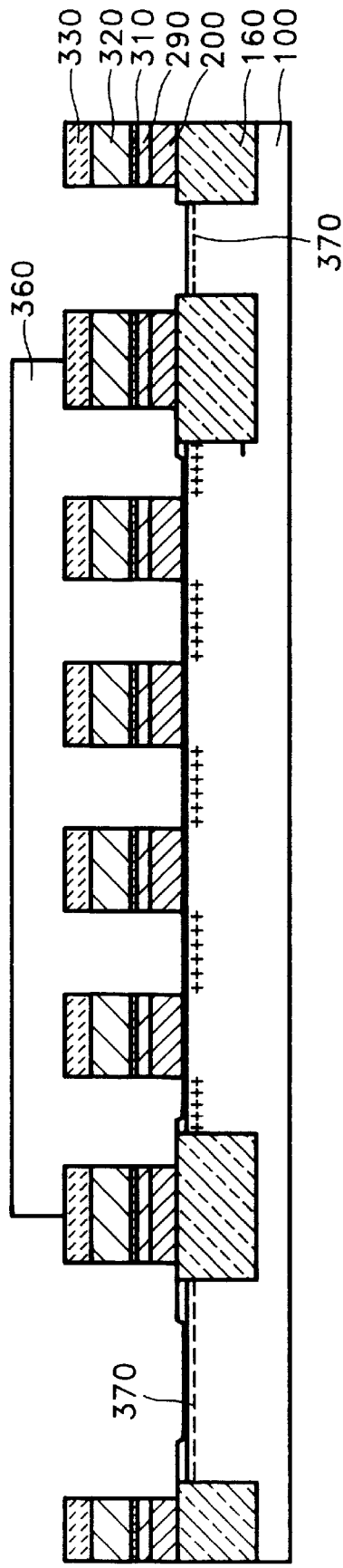
Figure 17B:
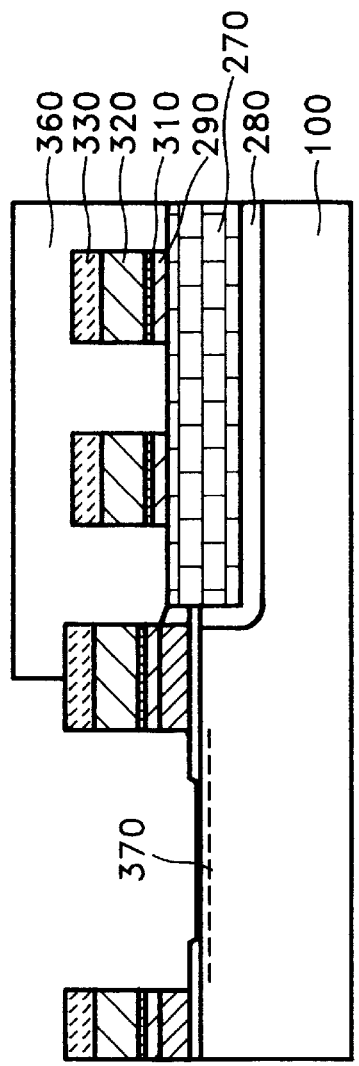
Figure 17C:
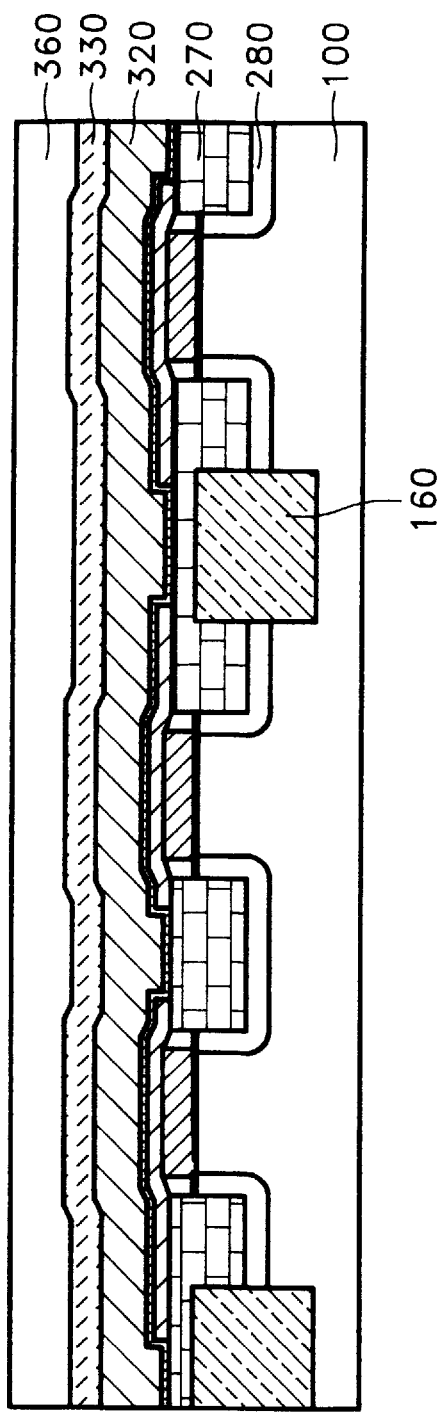
Figure 17D:
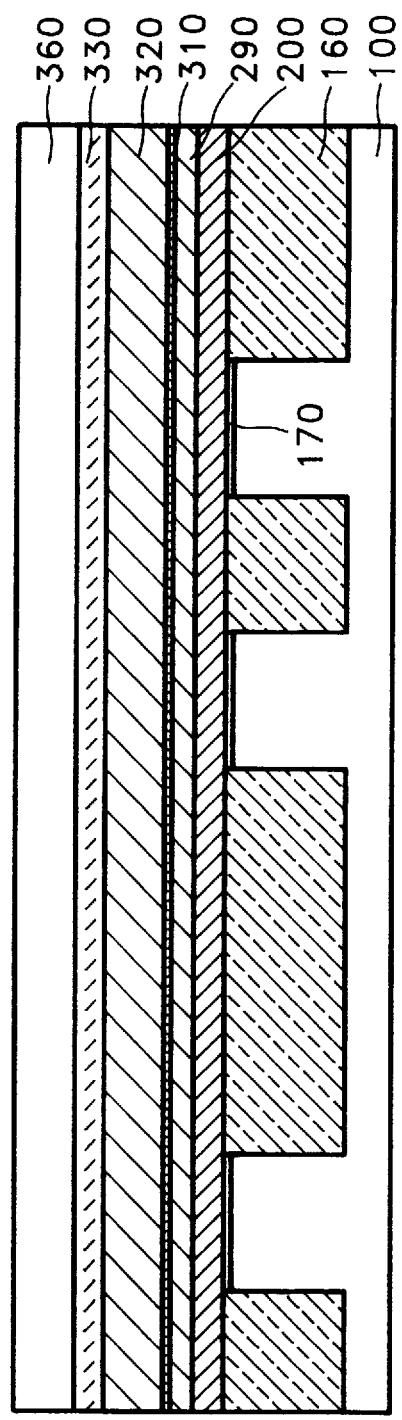

Referring to FIG. 8, in the DuSNOR cell according to the present invention, a word line 61, a string select line SSL and a ground select line GSL are formed horizontally, and a bit line 49, a first polysilicon film 45 for a floating gate and a second polysilicon film 47 for a floating gate are formed vertically. Reference numerals 41 and 43 indicate an active region and a tunnel region, respectively, and reference numeral 55 indicates an ion-implanted region for an $N^+$ source and drain.

Hereinafter, the flash memory device having the DuS-NOR cell according to the present invention shown in FIG. 7 and a manufacturing method therefor will be described, referring to following embodiments.

Embodiment 1

FIGS. 9A through 18A, 9B through 18B, 9C through 18C, and 9D through 18D are sectional views showing a method for manufacturing a flash memory device according to a first embodiment of the present invention.

In detail, FIGS. 9A through 18A are sectional views taken along line a–a' of FIG. 8, FIGS. 9B through 18B are sectional views taken along line b–b' of FIG. 8, FIGS. 9C through 18C are sectional views taken along line c–c' of FIG. 8 and FIGS. 9D through 18D are sectional views taken along line d–d' of FIG. 8.

FIGS. 9A through 9D show the steps of forming a pad oxide film 110, a first polysilicon layer 120 and a first silicon nitride film 130 in order to define an active region on a substrate 100.

First, an N-well (not shown) is formed in a semiconductor substrate 100 of a first conductive type, for example, a P-type silicon substrate, and then a pocket P-well (not shown) is formed in the N-well to perform a triple well process. The triple well process is necessary when positive or negative voltage is applied to a bulk during erase or program operation. However, when 0V is applied to the bulk during the erase or program operation, the cell can be operated by the P-type substrate without the pocket P-well.

Next, the pad oxide film 110 of approximately 240 Å is grown on the P-type substrate 100 or the pocket P-well. Then, the first polysilicon layer 120 of approximately 1000 Å is deposited on the pad oxide film 110, and a first silicon nitride film 130 of approximately 1500 Å is deposited thereon. A first photoresist pattern 140 is formed on the first silicon nitride film 130, and then the first silicon nitride film 130, the first polysilicon layer 120 and the pad oxide film 110 are dry-etched using the first photoresist pattern 140 as a mask.

Also, the substrate 100 is etched to a predetermined depth using the first photoresist pattern 140 as a mask, to thereby form a first trench 142. Next, the first photoresist pattern 140 is removed, and then a P-type impurity which is the same as that of the substrate 100, i.e., boron B for a channel stop, a having dose of $5.0E12\sim1.0E14/cm^2$ and an energy level of approximately 50 KeV is ion-implanted into the entire surface of the substrate 100. Reference numeral 150 of FIGS. 9A through 9D indicates an impurity layer for channel stop which is ion-implanted into the substrate 100.

FIGS. 10A through 10D show the steps of forming a field insulating film 160 and defining an active region on the substrate 100.

First, for a better surface of an etched silicon substrate, the silicon substrate 100 etched at approximately 800°~1000° C. is heat-treated or oxidized. Then, an oxide film of approximately 3000~1000 Å is formed on the entire surface of the substrate 100 where the trench 142 is formed, and then the oxide film is etched-back, to thereby form a field insulating film 160 for filling the trench 142.

The oxide film is formed using a chemical vapor deposition (CVD) method or a plasma enhancement CVD (PECVD) method. Here, the oxide film thickness should be more than half of width of the first trench 142. Next, the first silicon nitride film 130, the first polysilicon layer 120 and the pad oxide film 110 are removed. Here, in order to enhance the quality of a gate oxide film formed in a successive process, a series of processes wherein a sacrificial oxide film (not shown) of approximately 200~500 Å is grown and then removed, can be added. Then, a gate oxide film 170 of approximately 300 Å is grown on the active region of the substrate 100, and a second photoresist patten 180 is formed on the gate oxide film 170.

Next, the gate oxide film 170 is selectively wet-etched using the second photoresist pattern 180 as an etching mask. Here, the gate oxide film 170 in a portion where both a string select transistor and a ground select transistor are to be formed is not etched.

Then, in order to strengthen an isolation property between bit lines and drain lines to be formed, cell-field ion implantation can be performed on the entire surface of the substrate 100 using the impurity of the first conductive type, i.e., boron. The cell-field ion implantation can be performed at an energy level of approximately 100 KeV~300 KeV and a dose amount of $1.0E13\sim1.0E14/cm^2$.

The cell-field ion implantation can enhance the above isolation property between the bit lines and drains, and enhance a bulk punch-through property occurring in a channel of a memory cell, and control the initial threshold voltage of the cell. Here, after the cell-field ion implantation, ion implantation for controlling the initial threshold voltage can selectively be performed.

FIGS. 11A through 11D show a step of forming a tunnel to oxide film 175, a second polysilicon layer 200 for a floating gate and a second silicon nitride film 210.

First, the second photoresist pattern 180 used as the wet etching mask is removed. Next, the tunnel oxide film 175 of approximately 10 Å, i.e., the tunnel insulating film, is grown in a portion where the memory cell is to be formed, and then both the second polysilicon layer 200 for a floating gate of approximately 1500 Å, which is a first conductive layer, and a second silicon nitride film 210 of approximately 1000 Å are sequentially deposited. Then, a third photoresist pattern 220 is formed on the second silicon nitride film 210, and both the second silicon nitride film 210 and the second polysilicon layer 200 are dry-etched using the third photoresist pattern 220 as a mask. Here, it is preferable that an etched profile of the second polysilicon layer 200 for a floating gate is negative. This serves to prevent the generation of a stringer formed of a polysilicon film during self-aligned etching of a successive process.

FIGS. 12A through 12D show a step of etching the silicon substrate 100 in a portion where a source and drain of a memory cell are to be formed after forming a spacer 250.

First, both the second polysilicon layer 200 and a third photoresist pattern 220 used as an etching mask for the second silicon nitride film 210 are removed. Next, an oxide film is deposited on the entire surface of the substrate 100 to a thickness of approximately 1000~2000 Å, and then the deposited oxide film is etched, to thereby form the spacer 250 of 0.1~0.2 μm on a sidewall of both the second silicon nitride film 210 and the second polysilicon layer 200. Then, using both the second silicon nitride film 210 and the spacer 250 as a mask, a portion of the substrate where the source and drain of the memory cell are to be formed is trench-etched to a depth shallower than that of the first trench 142, to thereby form a second trench 144.

In order to form the source and drain of the memory cell on the entire surface of the trench-etched substrate 100, arsenic As having a dose of $1.0E15~6.0E15/cm^2$ is ion-implanted. Here, the angle of ion implantation is in the range of 0°~45° according to the surface profile of the trench-etched substrate. Accordingly, an impurity layer 260 for the source and drain of the cell is formed near the surface of the etched substrate 100.

FIGS. 13A through 13D show the step of forming a buried oxide layer 270, a buried junction layer 280 and a third polysilicon layer 290 for a floating gate.

In detail, an oxide film (not shown) thinner than 1000 Å is formed on the entire surface of the substrate 100 through deposition or thermal oxidation. Next, a boro-phoposilicate glass (BPSG) film of approximately 3000~6000 Å is deposited on the entire surface of the substrate where the oxide film is formed, and then the BPSG film is heat-treated at 900°~950° C. and planed. Then, the BPSG film is dry-etched until the second polysilicon layer 200 is exposed, to thereby form a buried oxide film 270, i.e., a buried insulating film, of approximately 2000 Å on the trench-etched substrate. Here, due to activation of the ion-implanted impurity layer 260 for the source and drain, the buried junction layer 280 is formed on a lower portion of the burial oxide film 270.

The third polysilicon layer 290 for a floating gate, i.e., a second conductive layer, is deposited on the entire surface of the substrate 100 to a thickness of approximately 1000 Å, and then a fourth photoresist pattern 300 for forming the floating gate is formed. Then, the third polysilicon layer 290 is dry-etched using the fourth photoresist pattern 300 as a mask. Here, the second polysilicon layer 200 and the third polysilicon 290 are connected, to thereby form a floating gate.

FIGS. 14A through 14D show the steps of forming an insulating film 310, a fourth polysilicon layer 320 for a control gate and an oxide film 330.

First, the fourth photoresist pattern 300 used as a mask during etching of the third polysilicon layer 290 is removed. Next, an oxide film of approximately 100 Å, a silicon nitride film of approximately 100~200 Å and an oxide film of approximately 30~60 Å are sequentially formed on the entire surface of the substrate, to thereby form an insulating film 310 having a oxide-nitride-oxide (ONO) structure on the third polysilicon layer 290. Also, the fourth polysilicon layer 320 for the control gate of approximately 3000 Å is deposited, and then an oxide film 330 of approximately 3000 Å is deposited thereon. Next, a fifth photoresist pattern (not shown) is formed on the oxide film 330 and then the oxide film 330 is dry-etched using the fifth photoresist pattern as a mask. The fifth photoresist pattern (not shown) used as an etching mask of the oxide film 330 is then removed.

FIGS. 15A through 15D show the steps of forming a string select line, a ground select line, a word line and a control gate.

In detail, the fourth polysilicon layer 320 for the control gate, the insulating film 310, the third polysilicon layer 290 and the second polysilicon layer 200 are sequentially etched using the etched oxide film 330 as an etching mask. Thus, a memory cell includes the control gate and the word line formed of the fourth polysilicon layer 320, the insulating film 310 formed of an ONO layer, and the floating gate formed of the second polysilicon layer 200 and the third polysilicon layer 290. Here, in view of the cell array, the string select line, the ground select line and the word line are formed.

FIGS. 16A through 16D show the step of performing ion-implantation for a cell channel stop.

In detail, a photoresist film formed on the entire surface of the substrate 100 is patterned, to thereby form a sixth photoresist pattern 340 Then, using the sixth photoresist pattern 340 as a mask, boron as impurity is ion-implanted with a dose of $1.0E12~1.0E14/cm^2$. This is for enhancing the isolation property between channels which are located between the source line and the drain line. Reference numeral 350 of FIGS. 16A through 16D indicate an impurity layer ion-implanted into the substrate 100 for the cell channel stop.

FIGS. 17A through 17D show the step of performing ion-implantation for a source and drain of a select transistor.

First, a seventh photoresist pattern 360 for the source and drain is formed on the structure thus far described and then As having a dose of $1.0E15~6.0E15/cm^2$ is ion-implanted, to thereby form an impurity layer 370. Thus, both a region wherein a bit line is contacted and a common source are formed.

FIGS. 18A through 18D show the step of forming a bit line 390.

First, the seventh photoresist pattern 360 used as the ion implantation mask is removed, and then both an oxide film and a BPSG film are deposited, to thereby form an interdielectric layer 380. Here, both an impurity layer 376 ion-implanted for the cell channel stop and an impurity layer 374 ion-implanted for the source and drain of the select transistor are formed. Next, the interdielectric layer 380 is etched to form a contact hole, and then a bit line 390 is formed on the entire surface of the resultant structure and connected to the substrate 100.

Embodiment 2

FIGS. 19A through 21A, FIGS. 19B through 21B, FIGS. 19C through 21C and FIGS. 19D through 21D are sectional views showing a manufacturing method of a flash memory device according to a second embodiment.

In detail, FIGS. 19A through 21A are sectional views as taken along line a–a' of FIG. 8, FIGS. 19B through 21B are sectional views taken along line b–b' of FIG. 8, FIGS. 19C through 21C are sectional views taken along line c–c' of FIG. 8 and FIGS. 19D through 21D are sectional views taken along line d–d' of FIG. 8. Here, the same reference numerals as those in the first embodiment indicate identical.

The steps performed in the second embodiment are the same as those performed in the first embodiment except for a step in which the substrate of the cell region is trench-etched.

First, the steps performed in the first embodiment as shown in FIGS. 9A through 15A, FIGS. 9B through 15B, FIGS. 9C through 15C and FIGS. 9D through 15D, are performed.

FIGS. 19A through 19D show a step of performing ion-implantation for the source and drain of the select transistor.

Figure 19A:
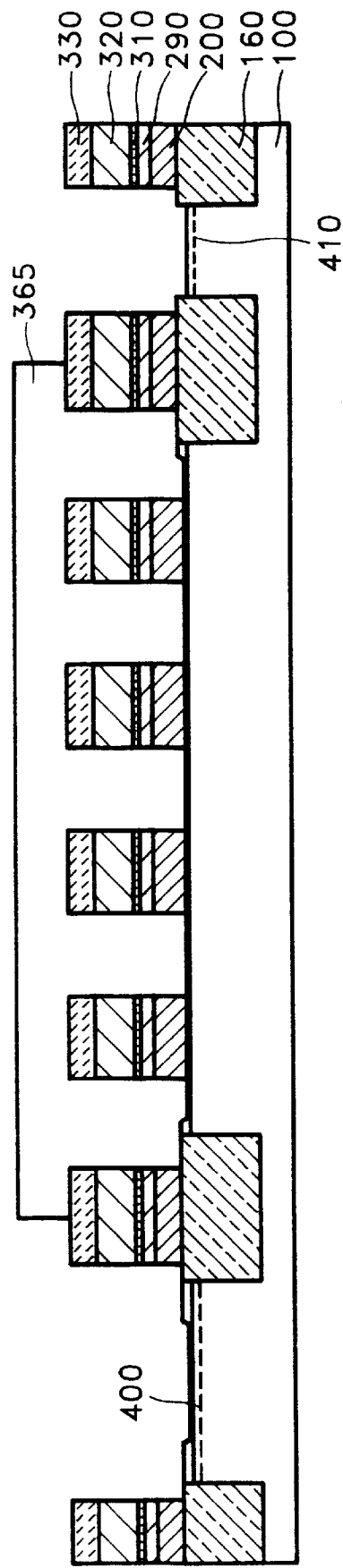
Figure 19B:
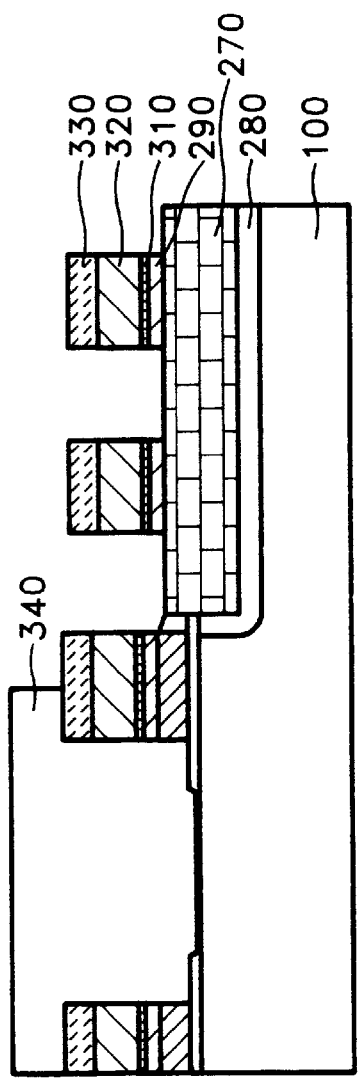
Figure 19C:
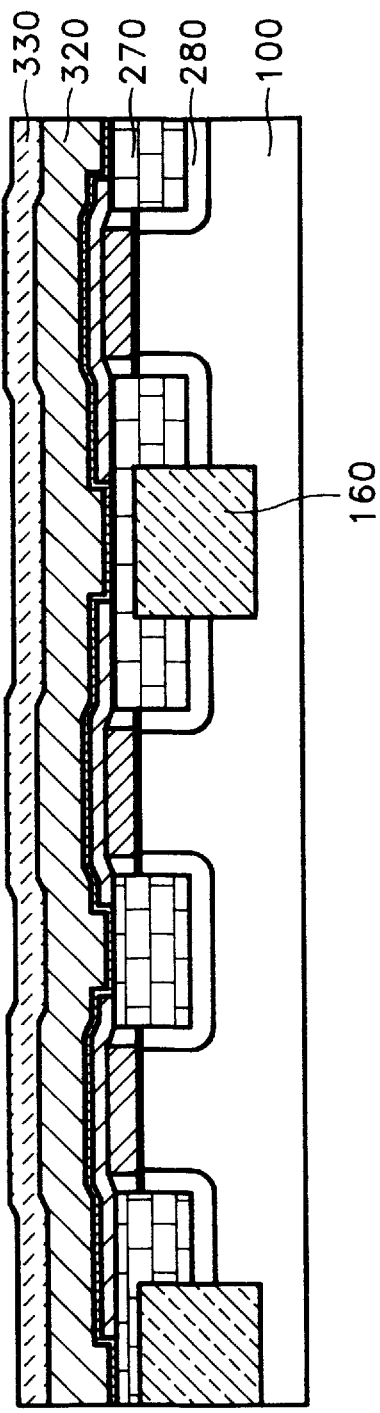
Figure 19D:
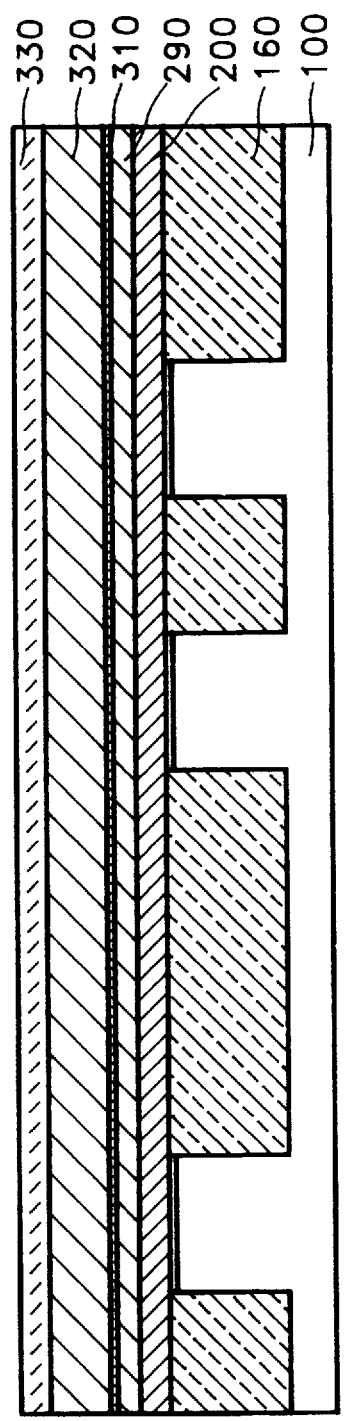
Figure 20A:
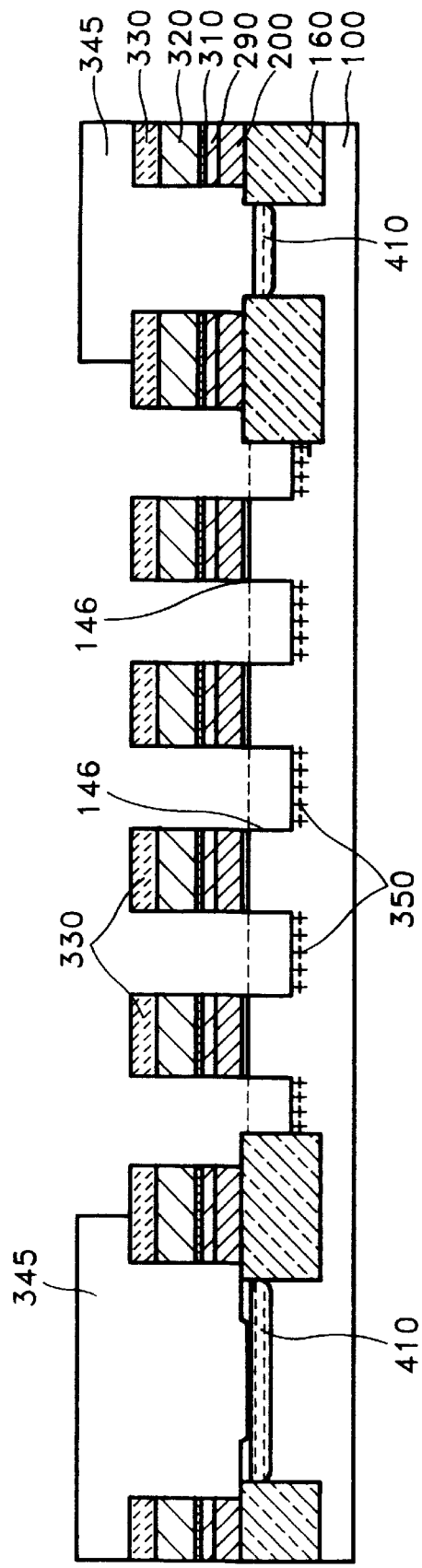
Figure 20B:
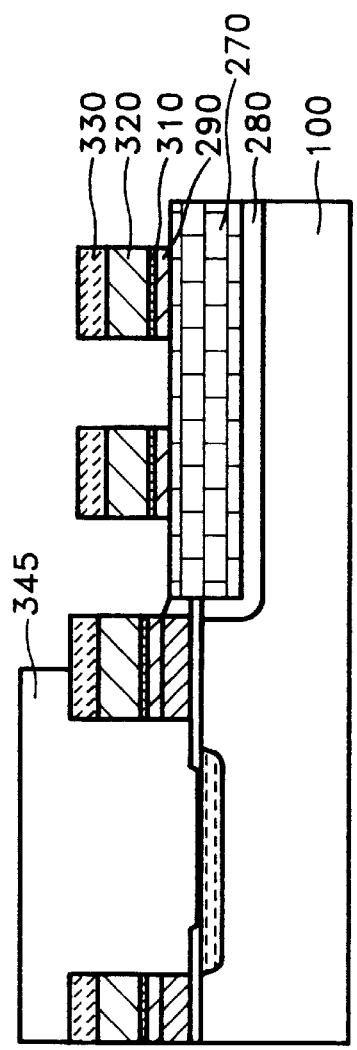

First, an eighth photoresist pattern 365 for the source and drain of the select transistor is formed on the structure thus far described, and then As having a dose of 1.0E15~6.0E15/$cm^2$ is ion-implanted using the eighth photoresist pattern 365 as a mask, to thereby form an impurity layer 370. Thus, both a region wherein a bit line is contacted and a common source are formed. Here, the embodiment shown in FIGS. 19B through 19D are the same as that shown in FIGS. 17B through 17D.

FIGS. 20A through 20D show the step of performing ion-implantation for the cell channel stop.

In detail, the eighth photoresist pattern 365 is removed. A photoresist film is formed on the entire surface of the substrate and patterned, to form a ninth photoresist pattern 345. Then, the substrate is trench-etched using the ninth photoresist pattern 345 and the oxide film 330 as an etching mask, to thereby form the third trench 146 for isolating channels. Next, boron having a dose of 1.0E12~1.0E14/$cm^2$ for the cell channel stop impurity is ion-implanted, using the ninth photoresist pattern 345 as a mask. This is for enhancing the isolation property between channels located between the source line and the drain line. Reference numeral 350 of FIG. 20A indicates an impurity layer ion-implanted into the substrate 100 for the cell channel stop. Reference numeral 410 indicates an impurity layer ion-implanted and activated for the source and drain of the select transistor.

FIGS. 21A through 21D show the step of forming the bit line 390.

First, the ninth photoresist pattern 345 used as the mask for ion-implantation is removed, and then both an oxide film and a BPSG film are deposited, to thereby form an interdielectric layer 380. Next, the interdielectric layer 380 is etched to form a contact hole having an exposed portion of an impurity layer 410 ion-implanted for the source and drain. Also, the bit line 390 connected to the impurity layer 410 is formed. Accordingly, the embodiment is completed. Reference numeral 420 of FIGS. 21A through 21D indicate an impurity layer ion-implanted for the cell channel stop and activated, and the embodiment shown in FIGS. 21B through 21D is the same as that shown in FIGS. 18B through 18D.

Hereinafter, referring to FIG. 7, the cell operation of a flash memory device having a DuSNOR cell according to the present invention will be described.

For the erase operation, in order to erase memory cells M14, M24, M34 and M44 connected to WL4, a high voltage of approximately 18 V is applied to the select word line WL4 and 0 V is applied to the unselect word lines. Next, 0 V is applied to bit lines BL1~BL4 and 5 V is applied to a string select line SSL, to thereby apply the bit line voltage of 0 V to a drain line. Then, 0 V is applied to GSL, to thereby switch-off ground select transistors T21 and T34, and further float the source line. Accordingly, electrons of the bulk are F-N tunneled to the floating gate by the voltages of the bulk of 0 V and the word line voltage of 15 V, to thereby increase the threshold voltage of the cell to 6~7 V. Thus, the erase operation is completed.

Next, when a memory cell M24 is to be programmed, a negative voltage of −8 V is applied to the select word line WL4 and 0 V is applied to unselect word lines. Then, 5 V is applied to a select bit line BL2 and 0 V is applied to non-selected bit lines BL1, BL3 and BL4. A voltage of 7 V or higher is applied to the SSL in order to apply the voltage of the bit line to a drain line without voltage drop by the threshold voltage of the string select transistor and 0 V is applied to the GLS in order to float the source line. As a result, according to both the 5 V applied to the drain line of the memory cell and the negative voltage of −8 V applied to the word line, electrons of the floating gate are F-N tunneled to the drain of the memory cell. Thus, the floating gate is discharged and the threshold voltage of the memory cell is maintained in a state of 1~2 V, to thereby complete the program operation.

Next, in the read operation of the cell approximately 1 V and 5 V are applied to the bit line and the word line, respectively, and 0 V is applied to both the common source and the bulk. Then, 5 V is applied to both the string select line SSL and the ground select line GSL, and thus both the SSL and GSL are activated. Accordingly, current passing through both the bit line and the common source is sensed, to thereby complete the read operation.

According to the flash memory device of the present invention, the bit lines are isolated through ion implantation into a buried oxide film which is buried in the trench and the cell field. Also, in a process of forming a tunnel oxide film, the bulk punch-through margin of a cell is increased through high-energy field ion-implantation and the floating gate includes a double polysilicon layer. Also, the string select transistor SSL, the ground select transistor GSL and the word line are formed using self-aligned etching, and cell channel stop isolation is performed by ion-implanting impurities. Accordingly, the flash memory device can maintain stable operation and is appropriate for high-integration.

It should be understood that the invention is not limited to the illustrated embodiments and many changes and modifications can be made within the scope of the invention by a person skilled in the art.

What is claimed is:

1. A flash memory device comprising:
   a semiconductor substrate of a first conductive type;
   a field insulating layer buried in a first trench formed in said semiconductor substrate in order to define an active region;
   a tunnel insulating film formed on said active region;
   a first conductive layer for a floating gate formed on said tunnel insulating film;
   spacers formed on both said tunnel insulating film and the sidewalls of said first conductive layer;
   a buried insulating layer buried in a second trench formed by etching said substrate adjacent to said spacers;
   a buried junction layer contacting a lower portion and sidewalls of said buried insulating layer, and acting as a source and drain region including impurities of a second conductive type;

a second conductive layer formed on said first conductive layer and connected to said first conductive layer to be used as a floating gate;

an insulating layer formed on said second conductive layer; and a third conductive layer for a control gate formed on said insulating layer.

2. A flash memory device according to claim 1, wherein said insulating layer is formed of a composite film of oxide/nitride/oxide film (ONO film).

3. A flash memory device according to claim 1, wherein said first and second conductive layers are formed of a polysilicon film.

4. A flash memory device according to claim 1, wherein said first conductive type is a P-type and said second conductive type is an N-type.

5. A flash memory device according to claim 1, wherein a depth of said first trench is greater than a depth of said second trench.

6. A flash memory device comprising:

a semiconductor substrate of a first conductive type;

a field insulating layer buried in a trench formed on said semiconductor substrate of a first conductive type in order to define an active region;

a tunnel insulating film formed on said active region;

first and second conductive layers which are patterned to define a plurality of floating gates which extend on said tunnel insulating film and said field insulating layer;

an insulating layer formed on said second conductive layer;

a third conductive layer for a control gate formed on said insulating layer;

a first impurity layer for cell channel stop regions formed of impurities of a first conductive type in said semiconductor substrate, said channel stop regions extending between said floating gates formed on said tunnel insulating film; and a second impurity layer for a source/drain region of a select transistor of a second conductive type, opposite to said first conductive type, in said semiconductor substrate, said source/drain region of the select transistor extending between said floating gates formed on said field insulating layer.

7. A flash memory device according to claim 6, wherein said first conductive type is a P-type and said second conductive type is an n-type.

8. A flash memory device comprising:

a semiconductor substrate of a first conductive type;

a field insulating layer buried in a first trench formed in said semiconductor substrate of a first conductive type in order to define an active region;

a tunnel insulating film formed on said active region;

first and second conductive layers which are patterned to define a plurality of floating gates which extend on said tunnel insulating film and said field insulating layer;

an insulating layer formed on said second conductive layer;

a third conductive layer for a control gate formed on said insulating layer;

a first impurity layer for cell channel stop regions formed of impurities of a first conductive type in a lower portion of a second trench formed by etching said semiconductor substrate between adjacent ones of said floating gates formed on said tunnel insulating layer; and a second impurity layer for a source and drain of a select transistor formed of a second conductive type, opposite to said first conductive type, in said semiconductor substrate between respective floating gates formed on said field insulating layer.

9. A flash memory device according to claim 8, wherein said first conductive type is a P-type, and said second conductive type is an N-type.

10. A flash memory device according to claim 8, wherein said first trench is deeper than said second trench.

* * * * *